(12) United States Patent
Chen et al.

(10) Patent No.: US 12,727,292 B2
(45) Date of Patent: Sep. 1, 2026

(54) METHOD OF MANUFACTURING ELECTRODE STRUCTURE

(71) Applicant: MIKRO MESA TECHNOLOGY CO., LTD., Apia (WS)

(72) Inventors: Li-Yi Chen, Tainan City (TW); Chieh-Ting Chen, Hsinchu City (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 412 days.

(21) Appl. No.: 18/530,216

(22) Filed: Dec. 6, 2023

(65) Prior Publication Data

US 2025/0194304 A1 Jun. 12, 2025

(51) Int. Cl.

*H10H 20/832* (2025.01)
*H10H 20/01* (2025.01)
*H10H 20/857* (2025.01)

(52) U.S. Cl.

CPC ........ *H10H 20/832* (2025.01); *H10H 20/857* (2025.01); *H10H 20/032* (2025.01); *H10H 20/0364* (2025.01)

(58) Field of Classification Search

CPC .. H10H 20/832; H10H 20/857; H10H 20/032; H10H 20/0364

See application file for complete search history.

(56) References Cited

U.S. PATENT DOCUMENTS

2025/0188638 A1* 6/2025 Chen .................... C25D 11/022

* cited by examiner

*Primary Examiner* — Eric W Jones
*Assistant Examiner* — Sammantha K Salaz
(74) *Attorney, Agent, or Firm* — CKC & Partners Co., LLC

(57) ABSTRACT

A method of manufacturing an electrode structure includes: etching the bottom metal layer through a first patterned photoresist including first and second mask portions to form a first metal pattern, a second metal pattern, and a bridge connected therebetween; removing the first mask portion; anodizing the bottom metal layer with the remained second mask portion by flowing an anodizing current from the first metal pattern; removing the remained second mask portion; depositing a conductive layer on the bottom metal layer to be in contact with an area of the second metal pattern that is unanodized; etching the conductive layer through a second patterned photoresist until an open segment of the bridge is exposed; and etching the open segment of the bridge through the second patterned photoresist until the bridge is electrically opened.

19 Claims, 19 Drawing Sheets

METHOD OF MANUFACTURING ELECTRODE STRUCTURE

BACKGROUND

Field of Invention

The present disclosure relates to a method of manufacturing an electrode structure.

Description of Related Art

The statements in this section merely provide background information related to the present disclosure and do not necessarily constitute prior art.

Traditional display manufacturing is a standardized process set. In recent years, there are more and more new types of displays such as a micro light-emitting diode display, a mini light-emitting diode display, and a quantum dot light-emitting diode display . . . etc., which are promising to dominate the future display market, and thus new display manufacturing processes are waiting to be set up. There are many steps contained in a manufacturing process set in order to produce one display, and reducing one of the steps thereof can reduce the cost and enhance the efficiency.

SUMMARY

According to some embodiments of the present disclosure, a method of manufacturing an electrode structure includes: forming a first patterned photoresist on a bottom metal layer, in which the first patterned photoresist includes a first mask portion and a second mask portion thicker than the first mask portion; etching the bottom metal layer through the first patterned photoresist to form a first metal pattern, a second metal pattern, and at least one bridge connected between the first and second metal patterns; removing the first mask portion while remaining the second mask portion which has a first sub-portion and a second sub-portion, in which the first sub-portion at least partially covers a top surface of the at least one bridge, and the second sub-portion covers at least one area of a top surface of the second metal pattern; anodizing the bottom metal layer with the remained second mask portion covering thereon by flowing an anodizing current from the first metal pattern to the second metal pattern via the at least one bridge; removing the remained second mask portion after the anodizing; depositing a conductive layer on the bottom metal layer after the remained second mask portion is removed, wherein the conductive layer is in contact with the at least one area of the second metal pattern; depositing a second patterned photoresist on the conductive layer, in which a vertical projection of the second patterned photoresist projected on the bottom metal layer at least overlaps the at least one area of the second metal pattern; etching the conductive layer through the second patterned photoresist until an open segment on the top surface of the at least one bridge that is unanodized is exposed; and etching the open segment of the at least one bridge through the second patterned photoresist until the at least one bridge is electrically opened.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
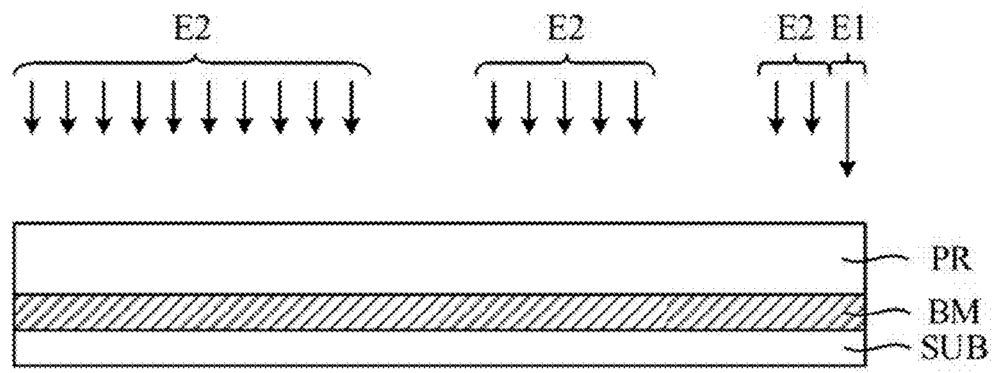
FIGS. 1A to 1J are schematic cross-sectional views of intermediate stages of a method of manufacturing an electrode structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

Reference is made to FIG. 1A. FIG. 1A is a schematic cross-sectional view of an intermediate stage of a method of manufacturing an electrode structure according to some embodiments of the present disclosure. As shown in FIG. 1A, a bottom metal layer BM is formed on a substrate SUB, and a photoresist PR is formed on the bottom metal layer BM. A material of the photoresist PR is positive tone photoresist. A first region of the photoresist PR is exposed with a first exposure dose E1 of light. Second regions of the photoresist PR are exposed with a second exposure dose E2 of light which is smaller than the first exposure dose E1. Third regions of the photoresist PR are not exposed. In some embodiments, the photoresist PR may be exposed by UV light, but the present disclosure is not limited in this regard. In some embodiments, the photoresist PR may be exposed by using a gray-tone mask (or a half-tone mask). For example, the half-tone mask may include full exposed portions where the full intensity of light (i.e., the first exposure dose E1) would be transmitted, half tone portions where parts of the light (e.g., the second exposure dose E2, which may be 20% to 60% of the first exposure dose E1) would be transmitted, and full tone portions where the light would be perfectly blocked.

In some embodiments, the bottom metal layer BM may include at least one element of aluminum, zirconium, hafnium, and tantalum. For example, an atomic ratio of aluminum in the bottom metal layer BM is greater than 80%.

In some other embodiments, the bottom metal layer BM may include at least one rare earth metal element.

In some other embodiments, the bottom metal layer BM may include aluminum and silicon. In this way, the bottom metal layer BM can have a better thin film quality.

Figure 1B:
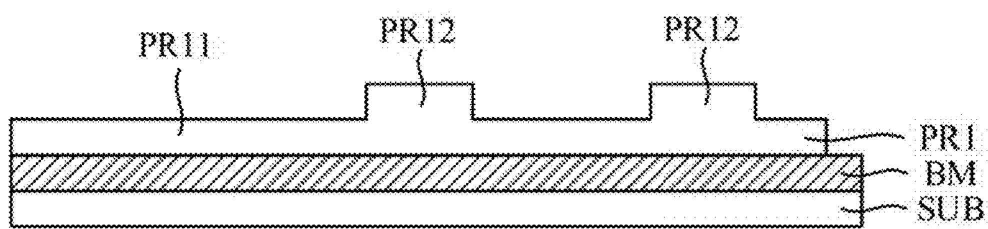

Reference is made to FIG. 1B. FIG. 1B is a schematic cross-sectional view of an intermediate stage of a method of manufacturing an electrode structure according to some embodiments of the present disclosure. The intermediate stage shown in FIG. 1A may be sequentially followed by the intermediate stage shown in FIG. 1B. As shown in FIG. 1B, the photoresist PR is exposed and developed to be a first patterned photoresist PR1 which include a first mask portion PR11 and a second mask portion PR12. The second mask portion PR12 is thicker than the first mask portion PR11. It can be seen that the regions of the photoresist PR exposed with the first exposure dose E1 will be entirely removed, the regions of the photoresist PR exposed with the second exposure dose E2 will be partially removed to form the first mask portion PR11, and the regions of the photoresist PR not exposed will be originally remained to form the second mask portion PR12.

Figure 1C:
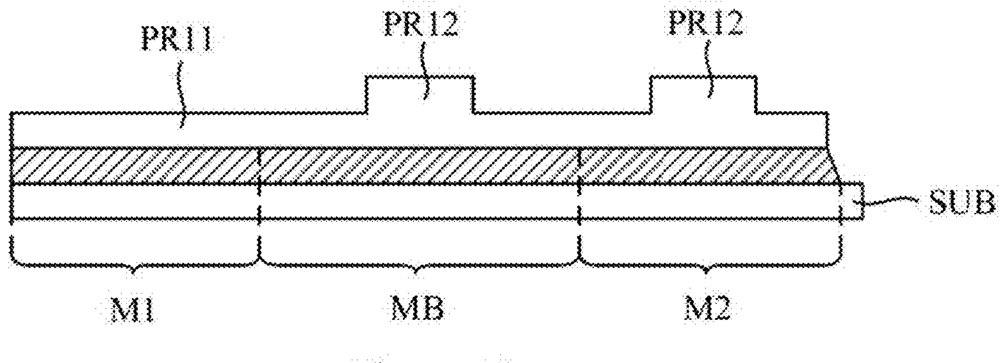

Reference is made to FIG. 1C. FIG. 1C is a schematic cross-sectional view of an intermediate stage of a method of manufacturing an electrode structure according to some embodiments of the present disclosure. The intermediate stage shown in FIG. 1B may be sequentially followed by the intermediate stage shown in FIG. 1C. As shown in FIG. 1C, the bottom metal layer BM is etched through the first patterned photoresist PR1 to form a first metal pattern M1, a second metal pattern M2, and a bridge MB connected between the first metal pattern M1 and the second metal pattern M2.

In some embodiments, a wet etching process may be performed to etch the bottom metal layer BM. In some embodiments, a PAN etchant (a mixture of phosphoric acid, acetic acid, nitric acid, and water) may be used in the wet etching process. For example, a mixing ratio of phosphoric acid, acetic acid, nitric acid, and water may be 16:1:1:2, but the present disclosure is not limited in this regard. In some other embodiments, hydrogen peroxide and sulfuric acid may be used in the wet etching process.

In some embodiments, a dry etching process may be performed to etch the bottom metal layer BM. For example, the dry etching process may be an ECCP (Enhanced Capacitance Coupled Plasma) process using, for example, $Cl_2$ and $BCl_3$, but the present disclosure is not limited in this regard.

Figure 1D:
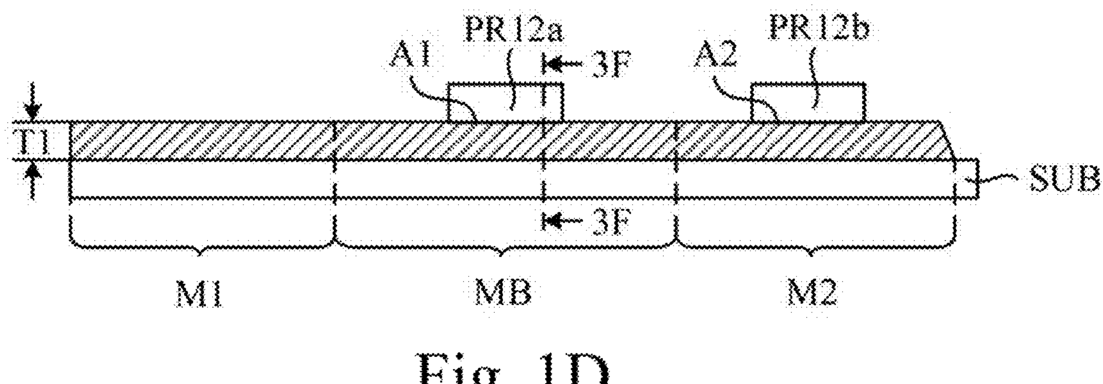

Reference is made to FIG. 1D. FIG. 1D is a schematic cross-sectional view of an intermediate stage of a method of manufacturing an electrode structure according to some embodiments of the present disclosure. The intermediate stage shown in FIG. 1C may be sequentially followed by the intermediate stage shown in FIG. 1D. As shown in FIG. 1D, the first mask portion PR11 is removed while the second mask portion PR12 is remained. In some embodiments, an ashing process is performed to the first mask portion PR11 and the second mask portion PR12 until the first mask portion PR11 is entirely removed and the second mask portion PR12 is still remained on the etched bottom metal layer BM. In some embodiments, oxygen plasma is used in the ashing process to perform the erosion of the first mask portion PR11 and the second mask portion PR12. Specifically, the remained second mask portion PR12 includes a first sub-portion PR12*a* and a second sub-portion PR12*b*. The first sub-portion PR12*a* covers an area A1 of a top surface of the bridge MB which is able to be etched to electrically open in an afterward process. The second sub-portion PR12*b* covers an area A2 of a top surface of the second metal pattern M2. In some embodiments, the area A1 may be an entirety of the top surface of the bridge MB.

Figure 1E:
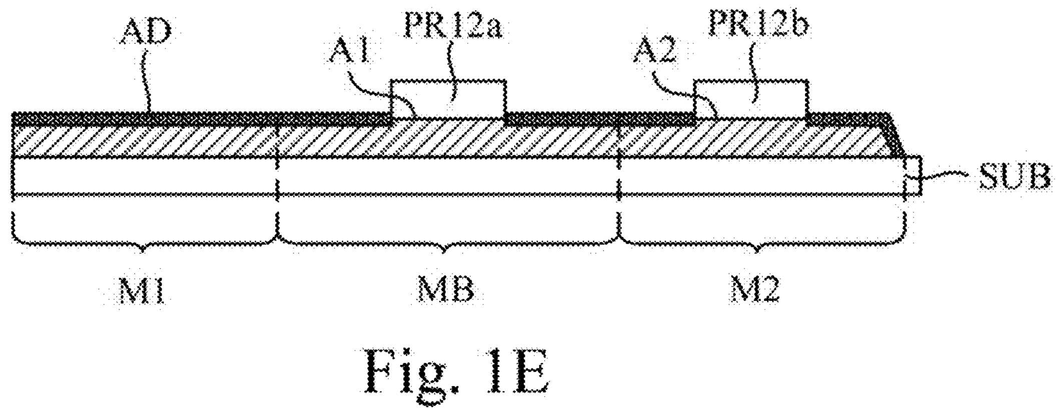
Figure 2A:
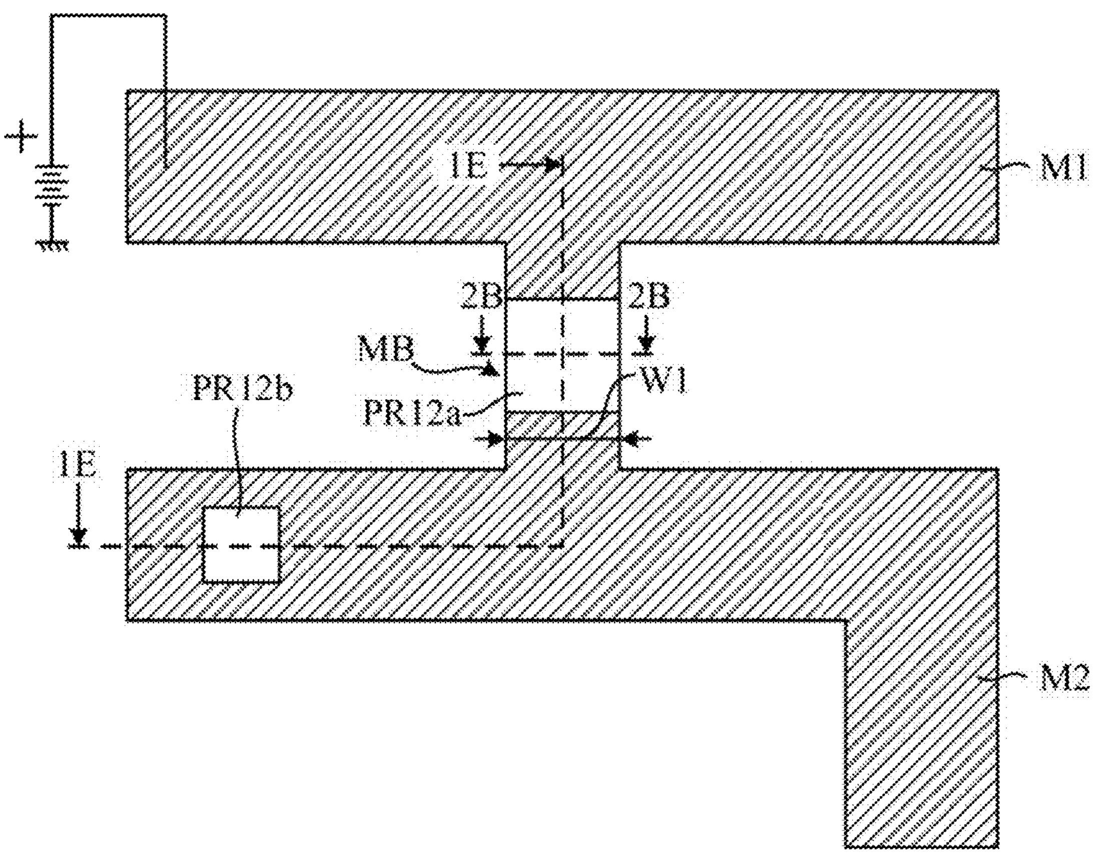
FIG. 2A is a partial top view of one of the intermediate stages according to some embodiments of the present disclosure.

Reference is made to FIGS. 1E and 2A. FIG. 1E is a schematic cross-sectional view of an intermediate stage of a method of manufacturing an electrode structure according to some embodiments of the present disclosure. FIG. 2A is a partial top view of the intermediate stage of FIG. 1E according to some embodiments of the present disclosure. Specifically, the schematic cross-sectional view of FIG. 1E is taken along line 1E-1E in FIG. 2A. The intermediate stage shown in FIG. 1D may be sequentially followed by the intermediate stage shown in FIGS. 1E and 2A. As shown in FIGS. 1E and 2A, the etched bottom metal layer BM is anodized with the remained second mask portion PR12 (i.e., the first sub-portion PR12*a* and the second sub-portion PR12*b*) covering thereon by flowing an anodizing current from the first metal pattern M1 to the second metal pattern M2 via the bridge MB. The etched bottom metal layer BM is partially anodized to have anodized parts AD (i.e., anodic oxide). The area A1 of the bridge MB and the area A2 of the second metal pattern M2 respectively in contact with the first sub-portion PR12*a* and the second sub-portion PR12*b* are unanodized after the anodization of the etched bottom metal layer BM is finished.

In some embodiments, the etched bottom metal layer BM is anodized to reach a termination voltage. The etched bottom metal layer BM has a thickness (e.g., a vertical thickness T1 of the etched bottom metal layer BM in FIG. 1D) and a line width (e.g., a lateral width W1 of the bridge MB in FIG. 2A) before being anodized, and the termination voltage is less than a smallest one of the thickness and the line width in nm divided by 0.9 $nm \cdot V^{-1}$. In this way, the etched bottom metal layer BM will not be fully anodized and leave conductive parts.

In some embodiments, the termination voltage that the etched bottom metal layer BM is anodized to reach is greater than 10 Volt and smaller than 500 Volt. It should be pointed out that if the etched bottom metal layer BM is anodized to reach a termination voltage greater than 500 Volt, the thickness of the anodized parts AD of the etched bottom metal layer BM may be too thick and result in high operation voltage of thin-film transistors to be manufactured.

In some embodiments, the etched bottom metal layer BM is anodized by applying a constant current greater than 0.5 $mA/cm^2$. In some embodiments, the constant current is between 0.05 $mA/cm^2$ and 5 $mA/cm^2$.

In some embodiments, the etched bottom metal layer BM is anodized until the termination voltage is reached and kept for at least 300 seconds. It makes more uniform thickness of the anodized parts AD of the etched bottom metal layer BM.

In some embodiments, an annealing process may be performed to the anodized bottom metal layer BM. In this way, the resistance of the anodized bottom metal layer BM (e.g., the anodized parts AD) to a second wet etching process (if any) can be increased. In some embodiments, an annealing temperature used in the annealing process is greater than 200° C., but the disclosure is not limited in this regard.

Figure 4:
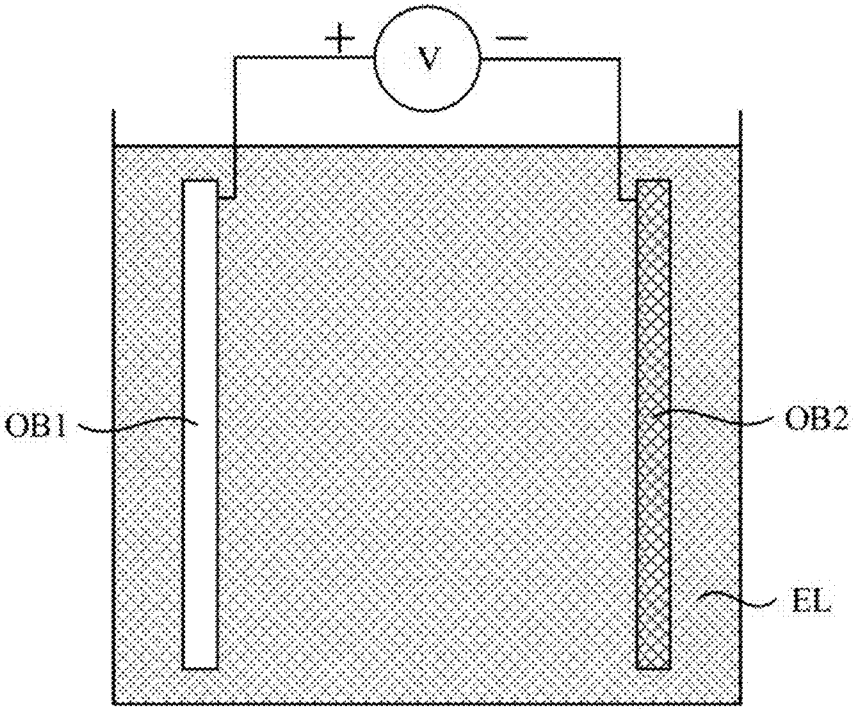
FIG. 4 is a schematic diagram illustrating an anodization process according to some embodiments of the present disclosure.

Reference is made to FIG. 4 in advance. FIG. 4 is a schematic diagram illustrating an anodization process according to some embodiments of the present disclosure. As shown in FIG. 4, an electrolyte EL is put in a container, an object OB1 to be anodized serves as an anode of a power source (e.g., a DC power), and an object OB2 having corrosion-resistant materials serves as a cathode of the power source. The object OB1 may be the structure as shown in FIG. 1D or a semi-finished product of a TFT (thin-film transistor) substrate. The object OB2 may include platinum or graphite.

In some embodiments, the etched bottom metal layer BM is anodized by using an electrolyte (e.g., the electrolyte EL in FIG. 4) with a pH value between pH5 and pH8. It should be pointed out that if the pH value is smaller than pH5 or greater than pH8, there will be more pores in the anodized parts AD of the etched bottom metal layer BM.

In some embodiments, the etched bottom metal layer BM is anodized by using an electrolyte (e.g., the electrolyte EL in FIG. 4) containing a content of water less than 45 wt %. In this way, the Hydrogen content in the anodized parts AD of the etched bottom metal layer BM can be small. The Hydrogen content may reduce the breakdown voltage of the gate insulator. Hydrogen sometimes affects the semiconductor layer A to be manufactured in FIG. 8G and reduces its stability.

In some embodiments, the etched bottom metal layer BM is anodized by using an electrolyte (e.g., the electrolyte EL in FIG. 4) containing water, ethylene glycol, and ammonium tartrate. For example, the electrolyte may contain ethylene glycol of about 68.5 wt %, water of about 30 wt %, and ammonium tartrate of about 1.5 wt %, but the disclosure is not limited in this regard.

In some embodiments, the etched bottom metal layer BM is anodized at a temperature under 15° C. In this way, the anodized parts AD of the etched bottom metal layer BM will be denser and thus the quality can be improved.

Figure 5:
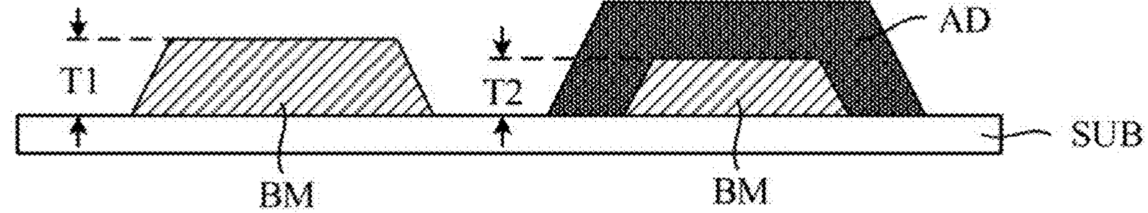
FIG. 5 is a schematic cross-sectional view of a bottom metal layer before and after being anodized according to some embodiments of the present disclosure.

Reference is made to FIG. 5 in advance. FIG. 5 is a schematic cross-sectional view of a bottom metal layer BM before and after being anodized according to some embodiments of the present disclosure. As shown in FIG. 5, in some embodiments, a thickness T2 of the unanodized part of the anodized bottom metal layer BM is equal to or greater than 1/10 of a thickness T1 of the bottom metal layer BM before being anodized. In this way, the resistance of the etched bottom metal layer BM will not be too large.

Figure 1F:
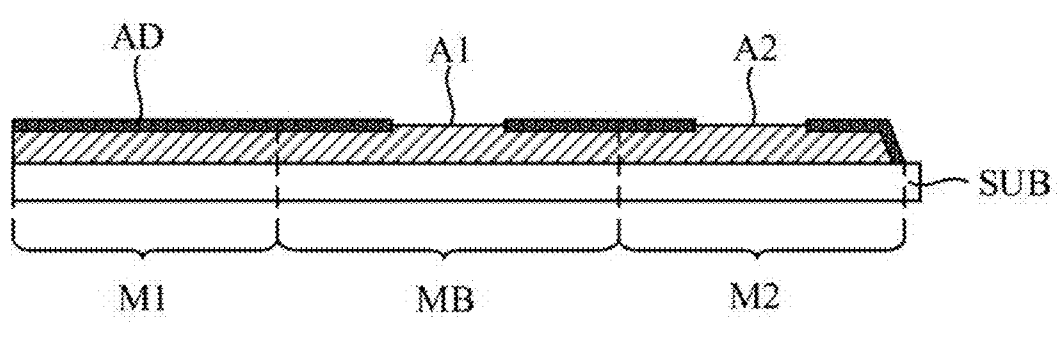

Reference is made to FIG. 1F. FIG. 1F is a schematic cross-sectional view of an intermediate stage of a method of manufacturing an electrode structure according to some embodiments of the present disclosure. The intermediate stage shown in FIG. 1E may be sequentially followed by the intermediate stage shown in FIG. 1F. As shown in FIG. 1F, the remained second mask portion PR12 (i.e., the first sub-portion PR12*a* and the second sub-portion PR12*b*) is removed, such that the area A1 of the bridge MB and the area A2 of the second metal pattern M2 that are unanodized are exposed.

Figure 1G:
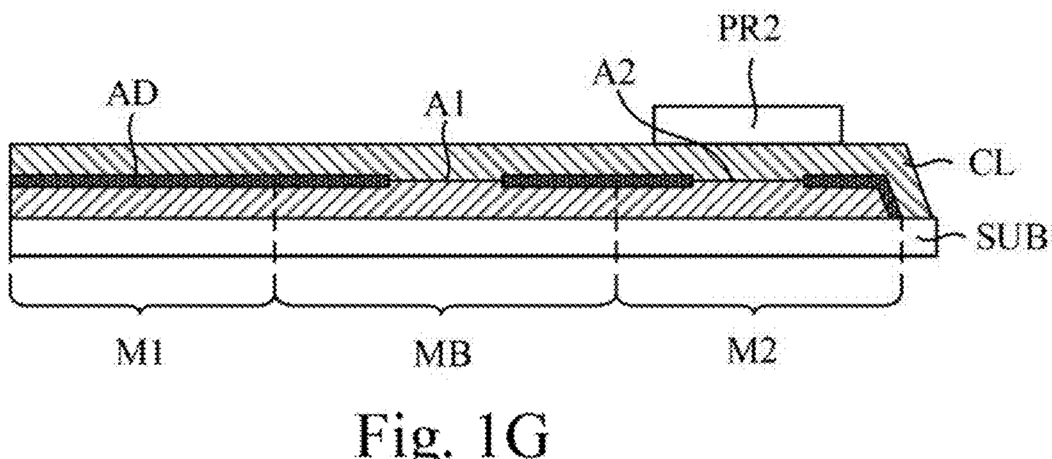

Reference is made to FIG. 1G. FIG. 1G is a schematic cross-sectional view of an intermediate stage of a method of manufacturing an electrode structure according to some embodiments of the present disclosure. The intermediate stage shown in FIG. 1F may be sequentially followed by the intermediate stage shown in FIG. 1G. As shown in FIG. 1G, a conductive layer CL is deposited on the anodized bottom metal layer BM after the remained second mask portion PR12 is removed, in which the conductive layer CL is in contact with the area A1 of the bridge MB and the area A1 of the second metal pattern M2. In addition, a second patterned photoresist PR2 is deposited on the conductive layer CL. A vertical projection of the second patterned photoresist PR2 projected on the anodized bottom metal layer BM overlaps the area A2 of the second metal pattern M2 without overlapping the area A1 of the bridge MB. The formation method of the second patterned photoresist PR2 may be the same as or similar to that of the first patterned photoresist PR1, so the formation of the second patterned photoresist PR2 can be referred to the description about FIGS. 1A and 1B and will not be repeated here.

Figure 1H:
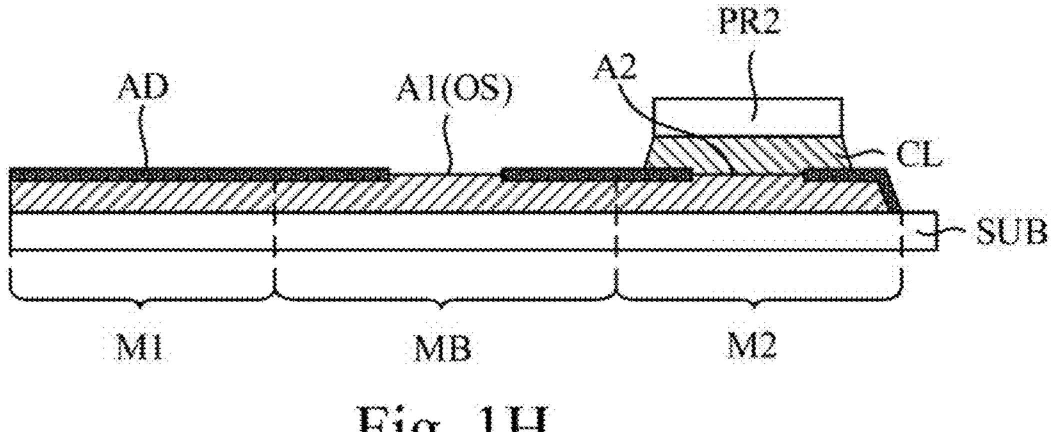

Reference is made to FIG. 1H. FIG. 1H is a schematic cross-sectional view of an intermediate stage of a method of manufacturing an electrode structure according to some embodiments of the present disclosure. The intermediate stage shown in FIG. 1G may be sequentially followed by the intermediate stage shown in FIG. 1H. As shown in FIG. 1H, the conductive layer CL is etched through the second patterned photoresist PR2 until an open segment OS on the top surface of the bridge MB is exposed. Meanwhile, the area A2 of the second metal pattern M2 is still covered by the etched conductive layer CL and the second patterned photoresist PR2. It should be pointed out that since the vertical projection of the second patterned photoresist PR2 projected on the anodized bottom metal layer BM does not overlap the area A1 of the bridge MB, the open segment OS is equal to the area A1 of the bridge MB and defined by the anodized parts AD of the etched bottom metal layer BM.

Figure 1I:
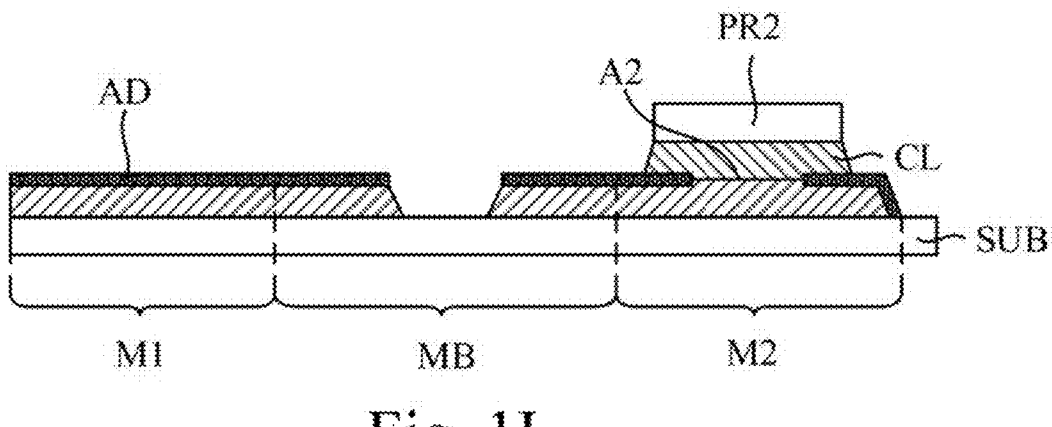

Reference is made to FIG. 1I. FIG. 1I is a schematic cross-sectional view of an intermediate stage of a method of manufacturing an electrode structure according to some embodiments of the present disclosure. The intermediate stage shown in FIG. 1H may be sequentially followed by the intermediate stage shown in FIG. 1I. As shown in FIG. 1I, the open segment OS of the bridge MB is etched through the second patterned photoresist PR2 until the bridge MB is electrically opened. In some embodiments, "the bridge MB is electrically opened" means the etched bridge MB forms an open circuit (i.e., electrically disconnected) between the first metal pattern M1 and the second metal pattern M2. To achieve the purpose of electrically opening the bridge MB, the open segment OS must extend to opposite edges of the top surface of the bridge MB.

Figure 1J:
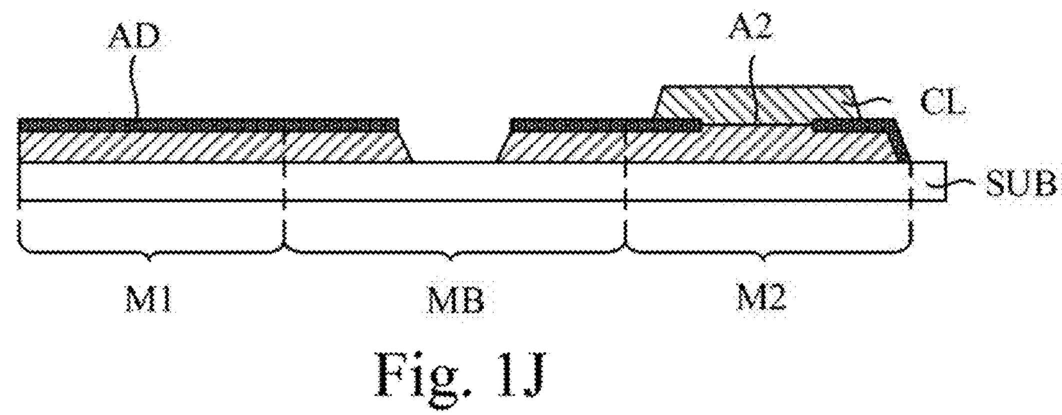
Figure 3A:
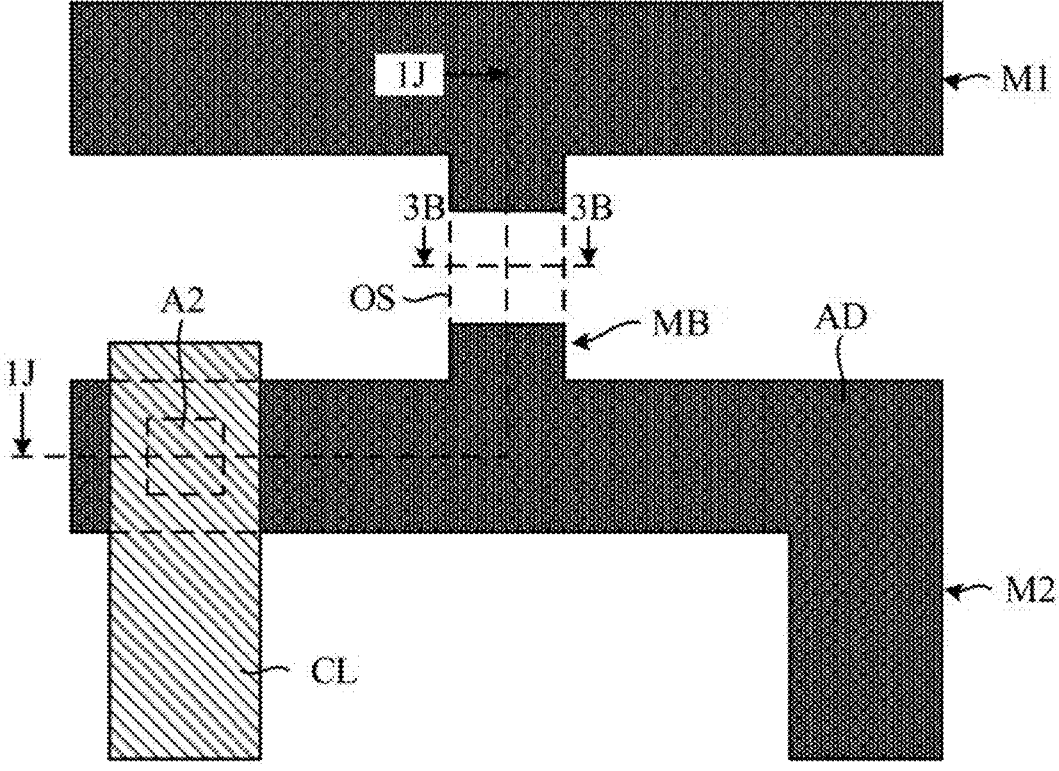
FIG. 3A is a partial top view of one of the intermediate stages according to some embodiments of the present disclosure.

Reference is made to FIGS. 1J and 3A. FIG. 1J is a schematic cross-sectional view of an intermediate stage of a method of manufacturing an electrode structure according to some embodiments of the present disclosure. FIG. 3A is a partial top view of the intermediate stage of FIG. 1J according to some embodiments of the present disclosure. Specifically, the schematic cross-sectional view of FIG. 1J is taken along line 1J-1J in FIG. 3A. The intermediate stage shown in FIG. 1I may be sequentially followed by the intermediate stage shown in FIGS. 1J and 3A. As shown in FIGS. 1J and 3A, the second patterned photoresist PR2 is removed to expose the etched conductive layer CL. In FIG. 3A, the open segment OS of the bridge MB which has been entirely removed is indicated by dashed lines.

Accordingly, it can be seen that the bottom metal layer BM can be processed to form a floating island structure (i.e., the second metal pattern M2 which is connected to the opened bridge MB) by the method of manufacturing an electrode structure of the embodiments as shown in FIGS. 1A to 1J which only uses two sets of PEP (Photo Engraving Process). Therefore, the cost of manufacturing an electrode structure can be significantly reduced and the manufacturing efficiency can be effectively enhanced.

Figure 2B:
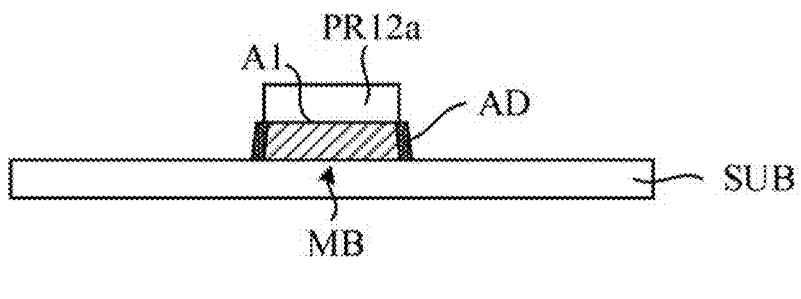
FIG. 2B is a cross-sectional view of the structure in FIG. 2A taken along line 2B-2B according to some embodiments of the present disclosure.
Figure 3B:
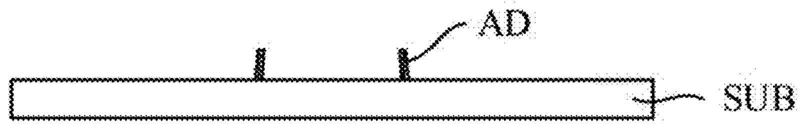
FIG. 3B is a cross-sectional view of the structure in FIG. 3A taken along line 3B-3B according to some embodiments of the present disclosure.

In FIG. 3A, although the open segment OS of the bridge MB which has been entirely removed is indicated by dashed lines, residues of the anodized parts AD originally in contact with the open segment OS of the bridge MB may still be left on the substrate SUB. Reference is made to FIGS. 2B and 3B. FIG. 2B is a cross-sectional view of the structure in FIG. 2A taken along line 2B-2B according to some embodiments of the present disclosure. FIG. 3B is a cross-sectional view of the structure in FIG. 3A taken along line 3B-3B according to some embodiments of the present disclosure. As shown in FIG. 3A with reference to 3B, after the open segment OS of the bridge MB is etched to be electrically opened, residues of the anodized parts AD originally in contact with the open segment OS of the bridge MB are left on the substrate SUB.

Figure 3C:
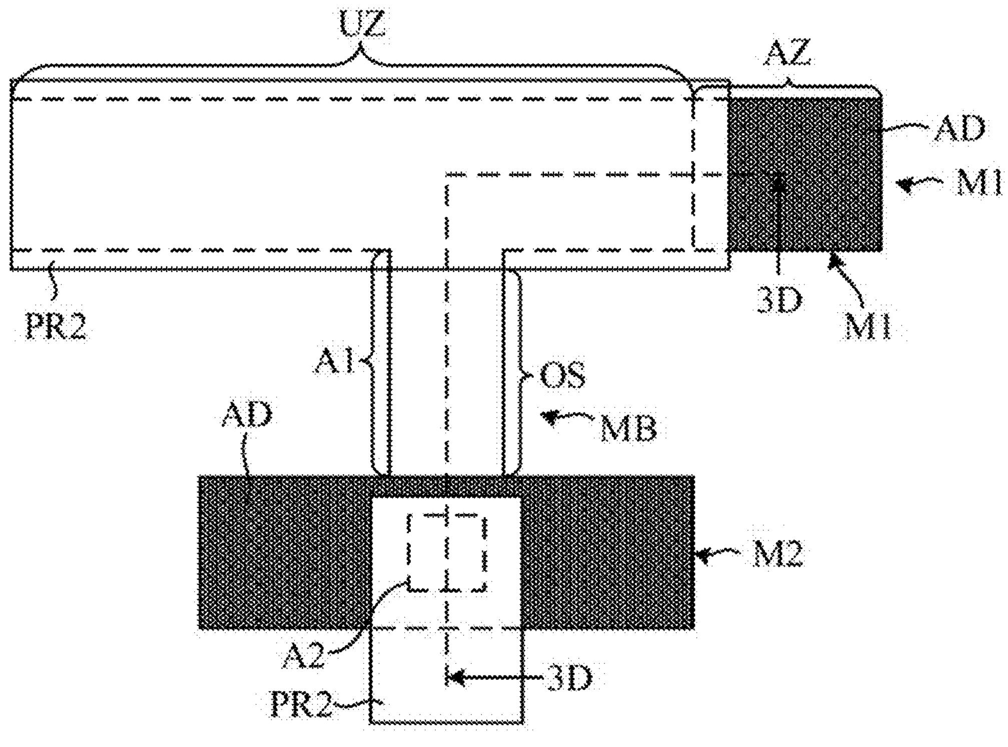
FIG. 3C is a partial top view of one of the intermediate stages according to some embodiments of the present disclosure.

Reference is made to FIG. 3C. FIG. 3C is a partial top view of one of the intermediate stages according to some embodiments of the present disclosure. The intermediate stage shown in FIG. 3C may be the same as the intermediate stage shown in FIG. 1H. As shown in FIG. 3C, the area A1 is only a part of the top surface of the bridge MB. In addition to covering the area A2 of the second metal pattern M2, the second patterned photoresist PR2 further covers a portion of the area A1 of the bridge MB. That is, the open segment OS is a part of the area A1, and is defined by the anodized parts AD of the etched bottom metal layer BM and the second patterned photoresist PR2 at the same time. Specifically, as shown in FIG. 3C, the upper and lower borders of the open segment OS are respectively defined by the second patterned photoresist PR2 and the anodized parts AD.

Figure 3D:
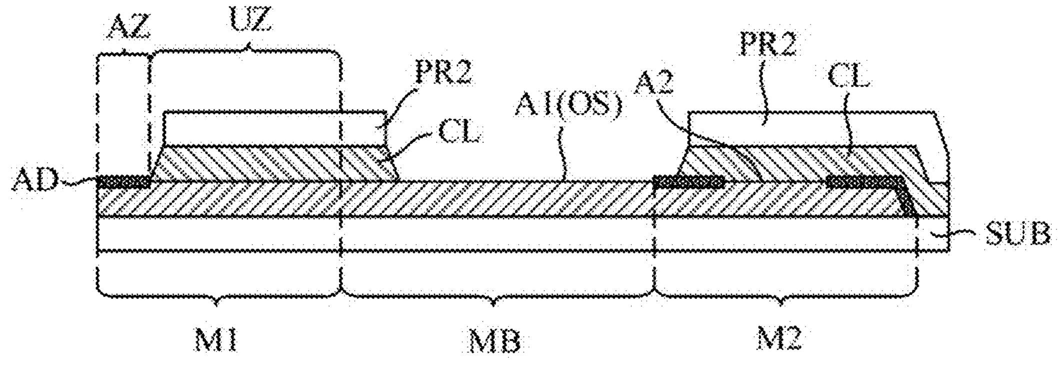
FIG. 3D is a partial cross-sectional view of the structure in FIG. 3C taken along line 3D-3D according to some embodiments of the present disclosure.

Reference is made to FIG. 3D. FIG. 3D is a partial cross-sectional view of the structure in FIG. 3C taken along line 3D-3D according to some embodiments of the present disclosure. As shown in FIGS. 3C and 3D, it can be seen that the top surface of the first metal pattern M1 has an anodized zone AZ and at least one unanodized zone UZ, and a part of the etched conductive layer CL covers and contacts the unanodized zone UZ. In this way, the part of the etched conductive layer CL covering and contacting the unanodized zone UZ can serve as a conductor of the first metal pattern M1, and the combination of the part of the etched conductive layer CL and the first metal pattern M1 has a lower resistance than the first metal pattern M1 alone. To obtain the anodized zone AZ and the unanodized zone UZ, the first sub-portion PR12*a* in the intermediate stage shown in FIG. 1E needs to further partially cover the top surface of the first metal pattern M1.

As shown in FIGS. 3C and 3D, an entirety of the unanodized zone UZ is covered by the etched conductive layer CL. That is, the entirety of the unanodized zone UZ is covered by the second patterned photoresist PR2. In this way, it can prevent the first metal pattern M1 from being etched to be electrically opened in the intermediate stage shown in FIG. 1I.

Figure 3E:
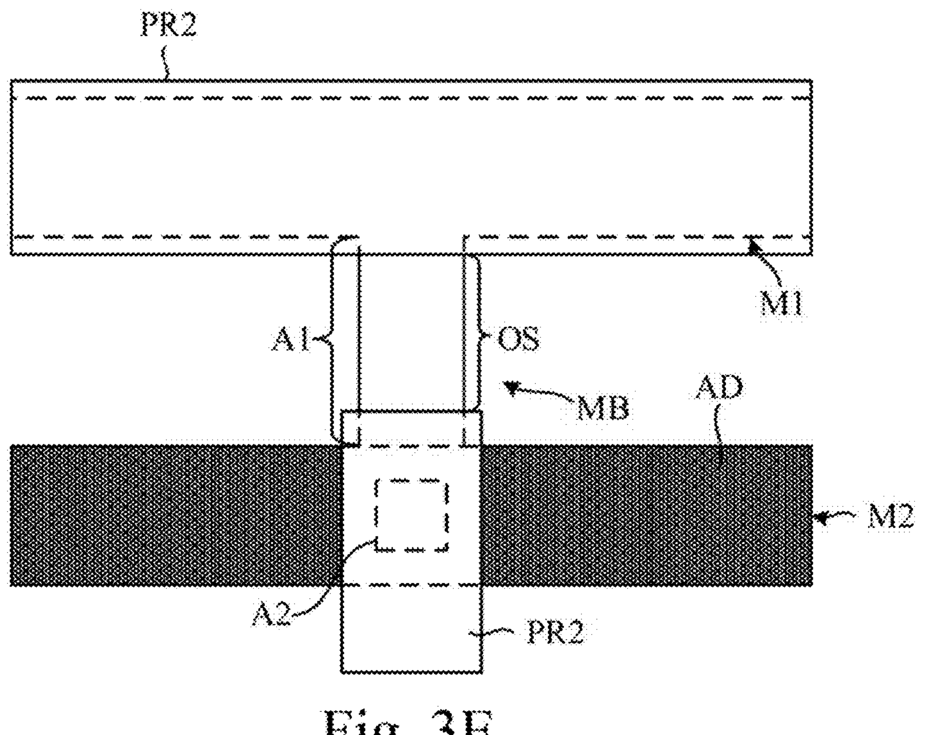
FIG. 3E is a partial top view of one of the intermediate stages according to some embodiments of the present disclosure.

Reference is made to FIG. 3E. FIG. 3E is a partial top view of one of the intermediate stages according to some embodiments of the present disclosure. The intermediate stage shown in FIG. 3E may be the same as the intermediate stage shown in FIG. 1H. As shown in FIG. 3E, the area A1 is an entirety of the top surface of the bridge MB. In addition to covering the area A2 of the second metal pattern M2, the second patterned photoresist PR2 further covers portions of the area A1 of the bridge MB. That is, the open segment OS is a part of the area A1, and is defined by the second patterned photoresist PR2 only. Specifically, as shown in FIG. 3E, the upper and lower borders of the open segment OS are both defined by the second patterned photoresist PR2.

Figure 3F:
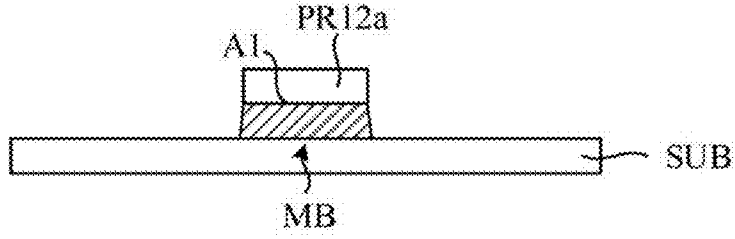
FIGS. 3F to 3H are schematic cross-sectional views of intermediate stages of a method of manufacturing an electrode structure according to some embodiments of the present disclosure.
Figure 3G:
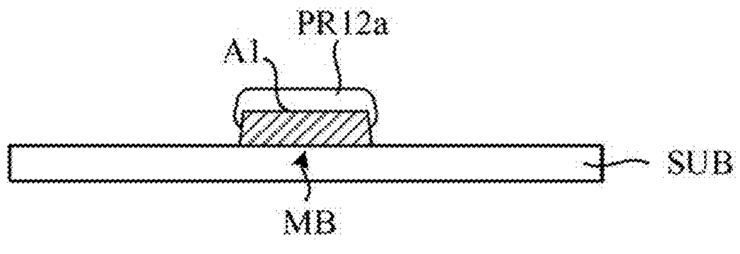
Figure 3H:
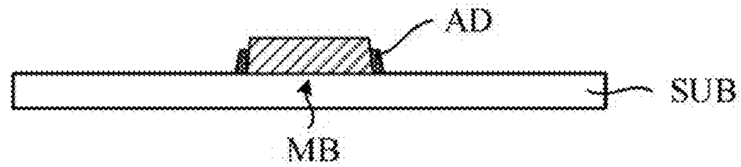

Reference is made to FIGS. 3F to 3H. FIGS. 3F to 3H are schematic cross-sectional views of intermediate stages of a method of manufacturing an electrode structure according to some embodiments of the present disclosure. FIG. 3F is a cross-sectional view of the structure in FIG. 1D taken along line 3F-3F according to some embodiments of the present disclosure. The intermediate stage shown in FIG. 3F may be sequentially followed by the intermediate stage shown in FIG. 3G. As shown in FIG. 3G, the first sub-portion PR12*a* on the top surface of the area A1 of the bridge MB is reflowed, such that the first sub-portion PR12*a* further partially covers sidewalls of the area A1 of the bridge MB. In order to reflow the first sub-portion PR12*a*, the first sub-portion PR12*a* is baked above the glass transition temperature (Tg) thereof. The intermediate stage shown in FIG. 3G may be sequentially followed by the intermediate stage shown in FIG. 3H. As shown in FIG. 3H, the bridge MB is anodized with the first sub-portion PR12*a* covering thereon, such that the top surface and parts of the sidewalls of the area A1 of the bridge MB in contact with the reflowed first sub-portion PR12*a* are unanodized after the anodization of the bridge MB is finished. Afterwards, the reflowed first sub-portion PR12*a* may be removed to expose the bridge MB, and then the bridge MB may be etched while residues of the anodized parts AD are left on the substrate SUB. Compared with the structure as shown in FIG. 2B, since the anodized parts AD in FIG. 3H expose more surface of the bridge MB, the bridge MB is more likely to be etched away.

Figure 6:
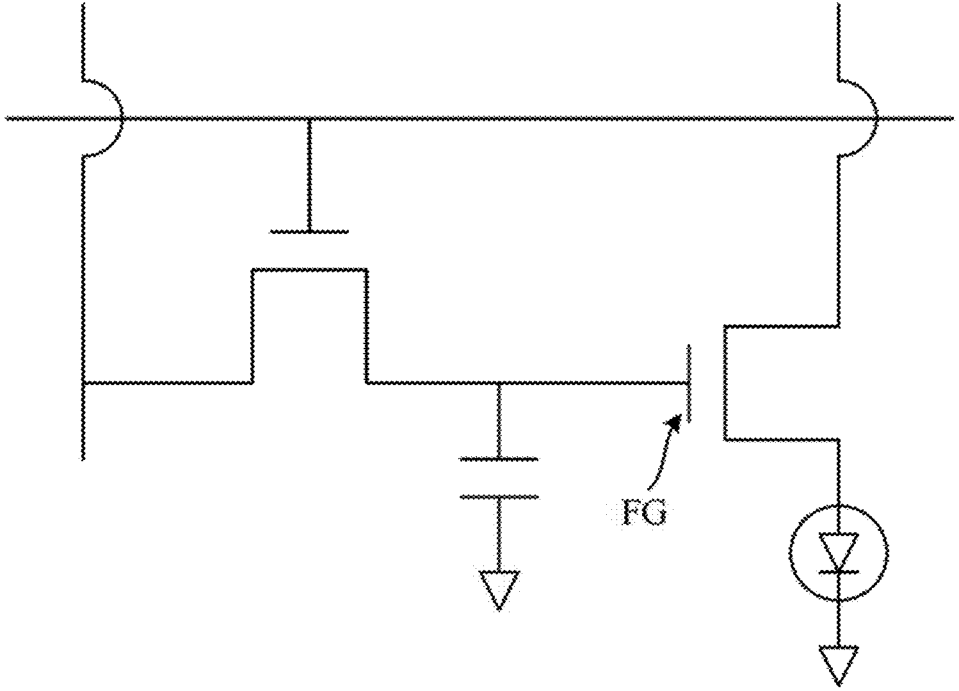
FIG. 6 is a circuit diagram of a 2T1C pixel circuit according to some embodiments of the present disclosure.

Reference is made to FIG. 6. FIG. 6 is a circuit diagram of a 2T1C pixel circuit according to some embodiments of the present disclosure. As shown in FIG. 6 with reference to FIGS. 1J and 3A, the second metal pattern M2 which is connected to the opened bridge MB may be used to serve as the floating gate FG as indicated in FIG. 6.

Figure 7A:
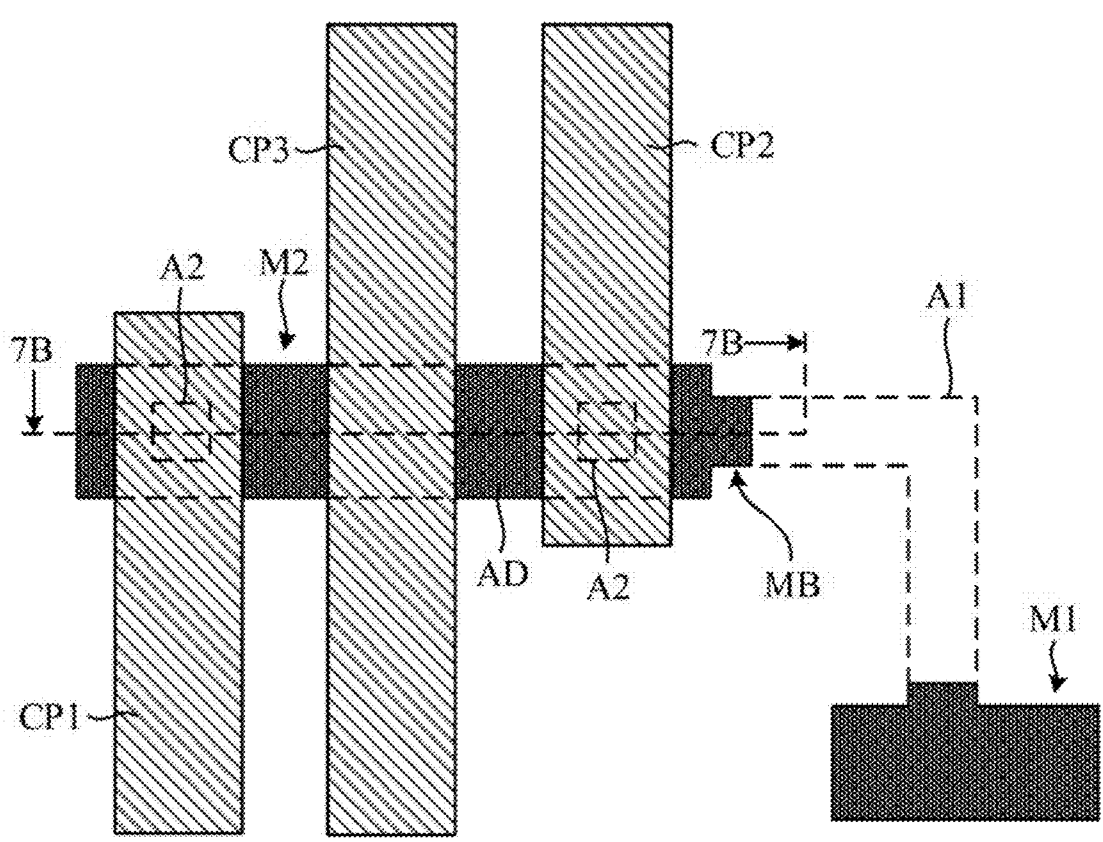
FIG. 7A is a partial top view of an electrode structure according to some embodiments of the present disclosure.
Figure 7B:
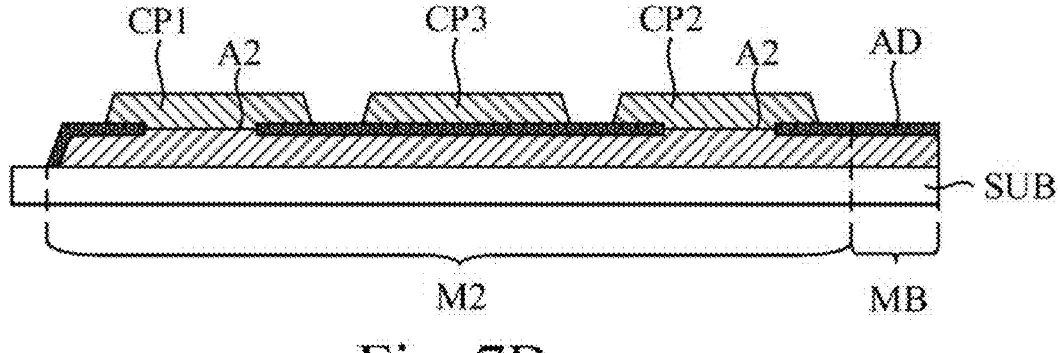
FIG. 7B is a schematic cross-sectional view of the electrode structure in FIG. 7A taken along line 7B-7B according to some embodiments of the present disclosure.

In some embodiments, a number of the second sub-portion PR12*b* in the intermediate stage as shown in FIG. 1D may be two, such that the anodized second metal pattern M2 will have two areas A2 that are unanodized in the intermediate stage as shown in FIG. 1E. Reference is made to FIGS. 7A and 7B. FIG. 7A is a partial top view of an electrode structure according to some embodiments of the present disclosure. FIG. 7B is a schematic cross-sectional view of the electrode structure in FIG. 7A taken along line 7B-7B according to some embodiments of the present disclosure. The intermediate stage as shown in FIGS. 7A and 7B corresponds to the intermediate stage as shown in FIGS. 1J and 3A. As shown in FIGS. 7A and 7B, conductive patterns CP1, CP2, and CP3 are formed from the conductive layer CL by the etching in the intermediate stage as shown in FIG. 1H, and the conductive patterns CP1, CP2, and CP3 extend across the anodized second metal pattern M2 with the conductive patterns CP1 and CP2 respectively in contact with the two areas A2 of the anodized second metal pattern M2. In this way, the etched conductive layer CL can form a metal cross over structure with the anodized second metal pattern M2.

In practical applications, the number of the areas A2 of the second metal pattern M2 may be more than two.

In some embodiments, the method of manufacturing an electrode structure of the present disclosure may be used to manufacture a thin-film transistor, which can be exemplified by FIG. 8A to FIG. 8K.

Figure 8A:
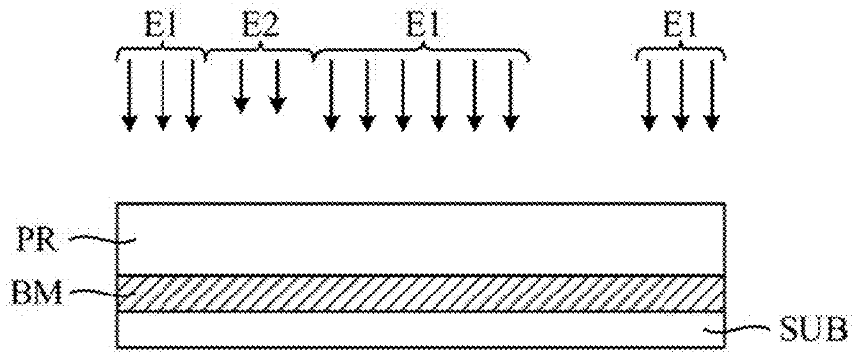
FIGS. 8A to 8K are schematic cross-sectional views of intermediate stages of a method of manufacturing an electrode structure according to some embodiments of the present disclosure.
Figure 8B:
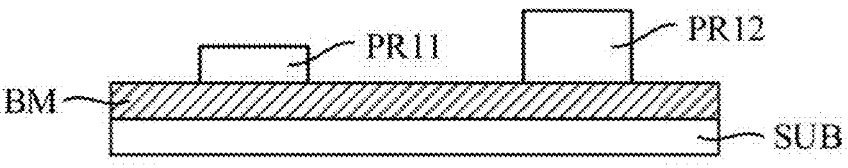

Reference is made to FIGS. 8A and 8B. FIGS. 8A and 8B are schematic cross-sectional views of an intermediate stage of a method of manufacturing an electrode structure according to some embodiments of the present disclosure. FIGS. 1A and 8A respectively show different cross sections in the same intermediate stage. FIGS. 1B and 8B respectively show different cross sections in the same intermediate stage. FIGS. 8A and 8B show the same cross section in different intermediate stages respectively.

Figure 8C:
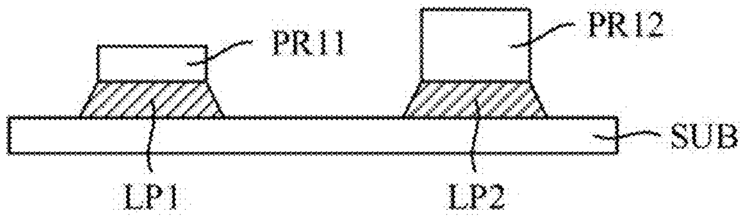

Reference is made to FIG. 8C. FIG. 8C is a schematic cross-sectional view of an intermediate stage of a method of manufacturing an electrode structure according to some embodiments of the present disclosure. The intermediate stage shown in FIG. 8B may be sequentially followed by the intermediate stage shown in FIG. 8C. FIGS. 1C and 8C respectively show different cross sections in the same intermediate stage. As shown in FIG. 8C, the bottom metal layer BM is etched through the first patterned photoresist PR1 to further form a first lower metal pattern LP1 and a second lower metal pattern LP2 that are respectively covered by the first mask portion PR11 and the second mask portion PR12.

Figure 8D:
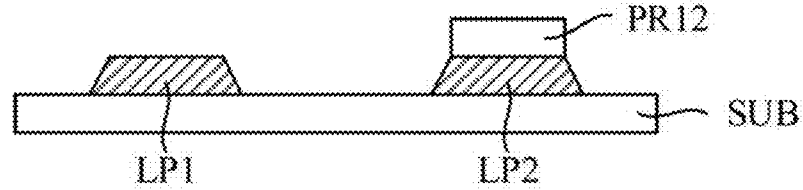

Reference is made to FIG. 8D. FIG. 8D is a schematic cross-sectional view of an intermediate stage of a method of manufacturing an electrode structure according to some embodiments of the present disclosure. The intermediate stage shown in FIG. 8C may be sequentially followed by the intermediate stage shown in FIG. 8D. FIGS. 1D and 8D respectively show different cross sections in the same intermediate stage. As shown in FIG. 8D, the first mask portion PR11 is removed to expose the top surfaces of the first lower metal pattern LP1.

Figure 8E:
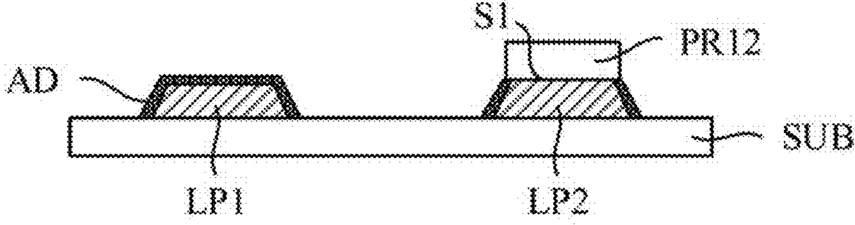

Reference is made to FIG. 8E. FIG. 8E is a schematic cross-sectional view of an intermediate stage of a method of manufacturing an electrode structure according to some embodiments of the present disclosure. The intermediate stage shown in FIG. 8D may be sequentially followed by the intermediate stage shown in FIG. 8E. FIGS. 1E and 8E respectively show different cross sections in the same intermediate stage. As shown in FIG. 8E, the etched bottom metal layer BM is anodized. The first lower metal pattern LP1 and the second lower metal pattern LP2 are partially anodized after the anodizing and thus have anodized parts AD (i.e., anodic oxide). The anodized second lower metal pattern LP2 has a surface portion S1 that is unanodized and in contact with the second mask portion PR12.

Figure 8F:
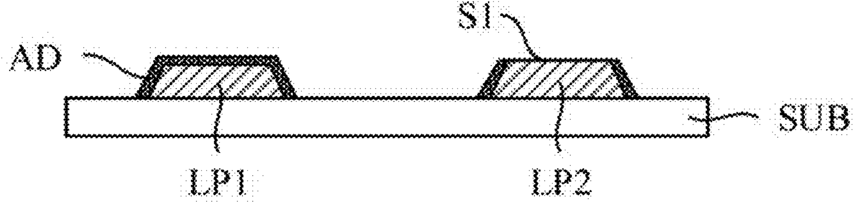

Reference is made to FIG. 8F. FIG. 8F is a schematic cross-sectional view of an intermediate stage of a method of manufacturing an electrode structure according to some embodiments of the present disclosure. The intermediate stage shown in FIG. 8E may be sequentially followed by the intermediate stage shown in FIG. 8F. FIGS. 1F and 8F respectively show different cross sections in the same intermediate stage. As shown in FIG. 8F, the second mask portion PR12 is removed to expose the surface portion S1 of the second lower metal pattern LP2 that is unanodized.

Figure 8G:
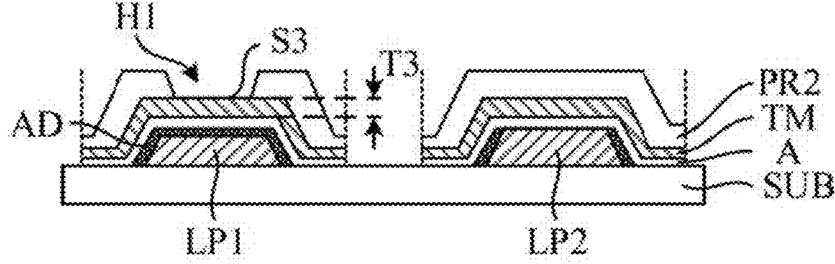

Reference is made to FIG. 8G. FIG. 8G is a schematic cross-sectional view of an intermediate stage of a method of manufacturing an electrode structure according to some embodiments of the present disclosure. The intermediate stage shown in FIG. 8F may be sequentially followed by the intermediate stage shown in FIG. 8G. FIGS. 1G and 8G respectively show different cross sections in the same intermediate stage. As shown in FIG. 8G, a semiconductor layer A is deposited on the anodized bottom metal layer BM to cover the first lower metal pattern LP1 and the second lower metal pattern LP2, such that the first lower metal pattern LP1 and the second lower metal pattern LP2 are in contact with the semiconductor layer A. The first lower metal pattern LP1 serves as a gate electrode, and the anodized part AD of the anodized first lower metal pattern LP1 serves as a gate insulator. In addition, a top metal layer TM is deposited on the semiconductor layer A. It should be pointed out that a surface of the top metal layer TM in contact with the semiconductor layer A contains metal that can be anodized (e.g., aluminum). In other words, a combination of the semiconductor layer A and the top metal layer TM shown in FIG. 8G corresponds to the conductive layer CL shown in FIG. 1G.

In some embodiments, the semiconductor layer A is an oxide semiconductor layer. In addition, the semiconductor layer A includes at least one element of aluminum, gallium, indium, zinc, tin, and zirconium, but the disclosure is not limited in this regard. In some other embodiments, the semiconductor layer A includes $MoS_2$.

In some embodiments, the semiconductor layer A may be deposited by a PVD (Physical Vapor Deposition) process or a CVD (Chemical Vapor Deposition) process.

In some embodiments, the semiconductor layer A may be a multi-layer structure containing different compositions. For example, the semiconductor layer A may be a double-layer structure including IZO (indium gallium zinc oxide) and IGZTO (indium gallium zinc tin oxide), but the disclosure is not limited in this regard. In this way, the channel mobility can be improved.

As shown in FIG. 8G, the second patterned photoresist PR2 is formed on the top metal layer TM. The second patterned photoresist PR2 has a first hollow portion H1 exposing a surface portion S3 of the top metal layer TM.

In some embodiments, the step of depositing the semiconductor layer A and the step of depositing the top metal layer TM are performed continuously in vacuum That is, the semiconductor layer A does not come into contact with the atmosphere before the top metal layer TM is deposited. In some other embodiments, the step of depositing the semiconductor layer A and the step of depositing the top metal layer TM are performed in chambers with transferring in vacuum. In this way, the oxide semiconductor layer A can be prevented from contacting with air.

Figure 8H:
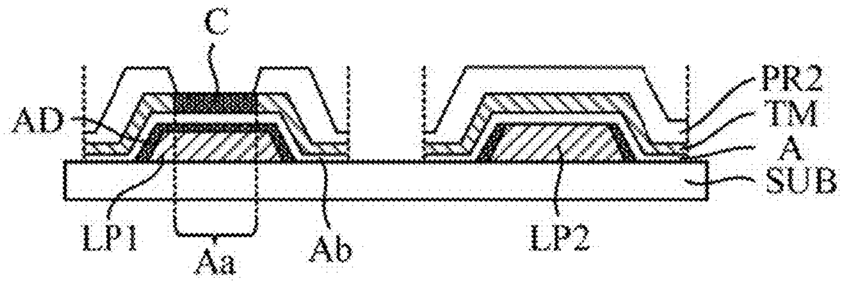

Reference is made to FIG. 8H. FIG. 8H is a schematic cross-sectional view of an intermediate stage of a method of manufacturing an electrode structure according to some embodiments of the present disclosure. The intermediate stage shown in FIG. 8G may be sequentially followed by the intermediate stage shown in FIG. 8H. As shown in FIG. 8H with reference to FIG. 8G, the surface portion S3 of the top metal layer TM is anodized through the second patterned photoresist PR2 until the top metal layer TM has an anodized segment C (i.e., anodic oxide) extended from the surface portion S3 of the top metal layer TM to a side of the top metal layer TM facing the semiconductor layer A. As mentioned above, the surface of the top metal layer TM in contact with the semiconductor layer A contains metal that can be anodized (e.g., aluminum), so that the top metal layer TM can be anodized to extend the anodized segment C to the side of the top metal layer TM facing the semiconductor layer A.

In some embodiments, the surface portion S3 of the top metal layer TM is anodized to reach a termination voltage. The top metal layer TM has a thickness T3 before being anodized, as shown in FIG. 8G. The termination voltage is greater than the thickness T3 in nm divided by 1.0 nm-$V^{-1}$. In this way, it can be ensured that the anodized segment C can reach the side of the top metal layer TM facing the semiconductor layer A.

In some embodiments, as shown in FIG. 8H, the semiconductor layer A has a channel area Aa and a conduction area Ab. The channel area Aa is covered by and in contact with the anodized segment C. The channel area Aa may be defined by a vertical projection of the anodized segment C projected on the semiconductor layer A. The conduction area Ab is covered by and in contact with the other conductive segment of the top metal layer TM. In order to reduce the contact resistance of the conduction area Ab relative to the top metal layer TM, an annealing process may be performed to make the conduction area Ab react with aluminum in the top metal layer TM. Aluminum increases the oxygen vacancies of the conduction area Ab of the semiconductor layer A thus its resistance is reduced. The annealing process also improves the stability of the channel area Aa of the semiconductor layer A.

Figure 8I:
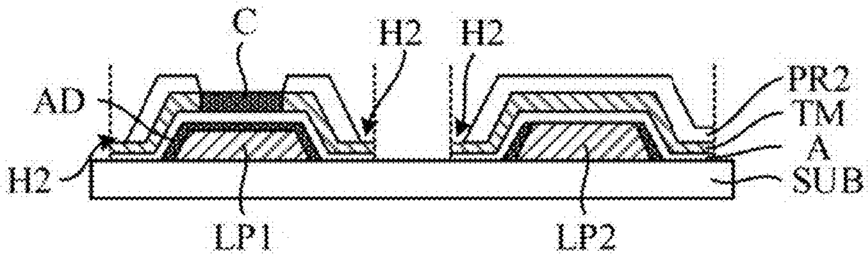

Reference is made to FIG. 8I. FIG. 8I is a schematic cross-sectional view of an intermediate stage of a method of manufacturing an electrode structure according to some embodiments of the present disclosure. The intermediate stage shown in FIG. 8H may be sequentially followed by the intermediate stage shown in FIG. 8I. As shown in FIG. 8I, second hollow portions H2 are formed in the second patterned photoresist PR2. In some embodiments, an ashing process is performed to the second patterned photoresist PR2 until the second hollow portions H2 are formed to expose portions of the top metal layer TM. In some embodiments, oxygen plasma is used in the ashing process to perform the erosion of the second patterned photoresist PR2.

Figure 8J:
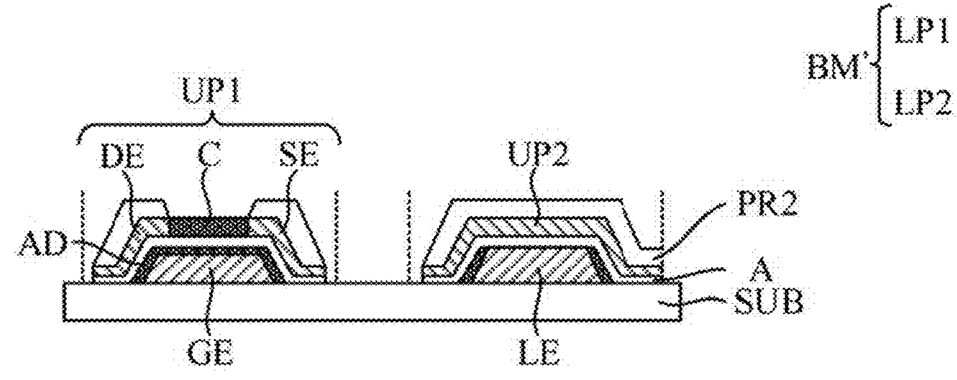

Reference is made to FIG. 8J. FIG. 8J is a schematic cross-sectional view of an intermediate stage of a method of manufacturing an electrode structure according to some embodiments of the present disclosure. The intermediate stage shown in FIG. 8I may be sequentially followed by the intermediate stage shown in FIG. 8J. As shown in FIG. 8J, the top metal layer TM is etched through the second hollow portions H2 to form a first upper metal pattern UP1 and a second upper metal pattern UP2. The first upper metal pattern UP1 is above the anodized first lower metal pattern LP1 and has a drain electrode DE and a source electrode SE. The drain electrode DE and the source electrode SE are connected to the anodized segment C and electrically isolated from each other by the anodized segment C. The anodized segment C serves as a channel protect structure. The second upper metal pattern UP2 is above the second lower metal pattern LP2. The second upper metal pattern UP2 forms a contact structure with the second lower metal pattern LP2.

In some embodiments, an etch selectivity of the top metal layer TM and the anodized segment C in the step of etching the top metal layer TM (as shown in FIG. 8J) is higher than 2.0.

Figure 8K:
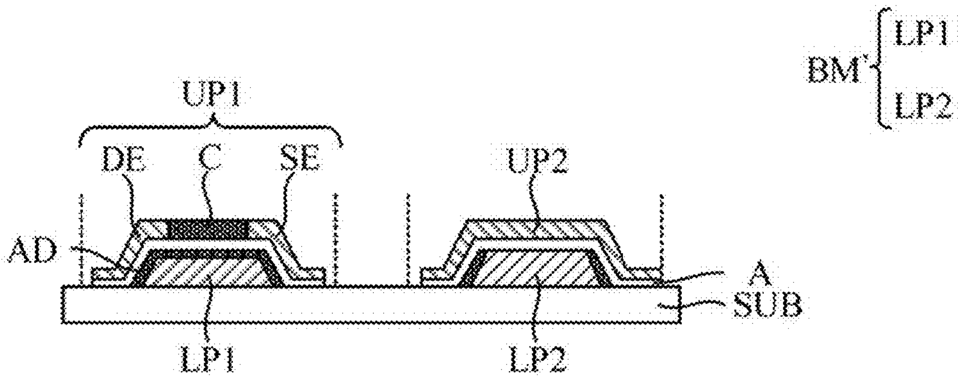

Reference is made to FIG. 8K. FIG. 8K is a schematic cross-sectional view of an intermediate stage of a method of manufacturing an electrode structure according to some embodiments of the present disclosure. The intermediate stage shown in FIG. 8J may be sequentially followed by the intermediate stage shown in FIG. 8K. As shown in FIG. 8K, the second patterned photoresist PR2 is removed to expose the first upper metal pattern UP1 and the second upper metal pattern UP2.

In some embodiments, a thickness of the semiconductor layer A is equal to or smaller than 100 nm. In this way, the back channel leakage may be reduced in certain circumstances. In addition, the problem of excessive contact resistance between the semiconductor layer A and other layers in contact with the semiconductor layer A (i.e., the second lower metal pattern LP2, the second upper metal pattern UP2, the drain electrode DE, and the source electrode SE) can be avoided.

Figure 9:
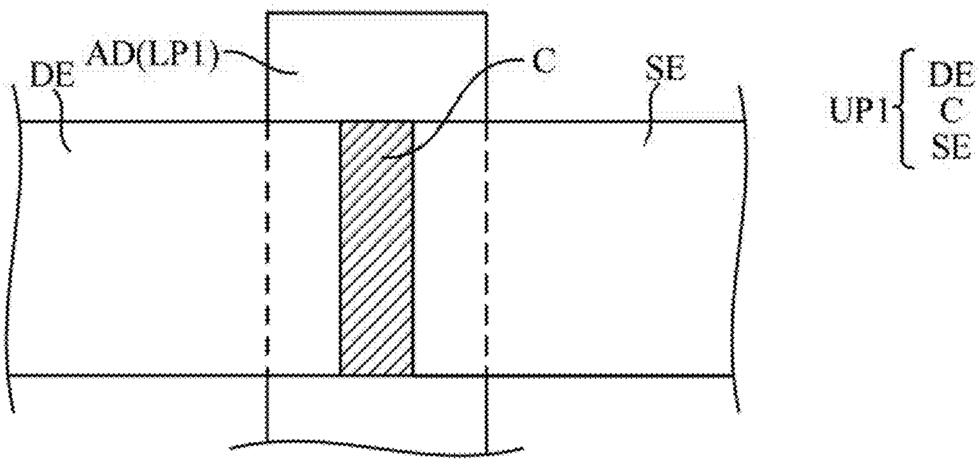
FIG. 9 is a partial top view of the structure shown in FIG. 8K according to some embodiments of the present disclosure.

Reference is made to FIG. 9. FIG. 9 is a partial top view of the structure shown in FIG. 8K according to some embodiments of the present disclosure. In detail, FIG. 9 is a partial schematic diagram showing the anodized first lower metal pattern LP1 (covered by the anodized part AD) and the first upper metal pattern UP1.

Figure 10A:
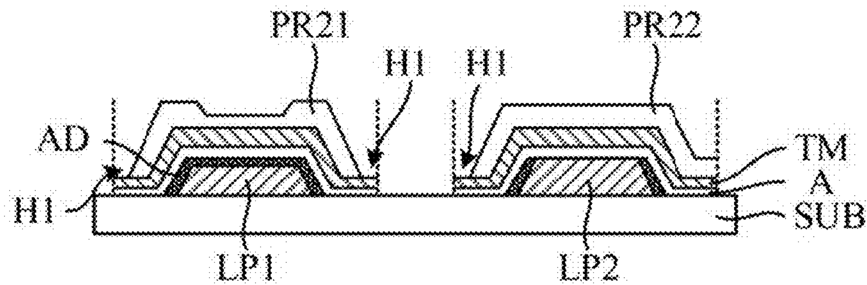
FIGS. 10A to 10E are schematic cross-sectional views of intermediate stages of a method of manufacturing an electrode structure according to some embodiments of the present disclosure.

Reference is made to FIG. 10A. FIG. 10A is a schematic cross-sectional view of an intermediate stage of a method of manufacturing an electrode structure according to some embodiments of the present disclosure. In some embodiments, the intermediate stage shown in FIG. 8F may be directly followed by the intermediate stage shown in FIG. 10A. As shown in FIG. 10A, a semiconductor layer A is deposited on the anodized bottom metal layer BM, and a top metal layer TM is deposited on the semiconductor layer A. The deposition methods of the semiconductor layer A and the top metal layer TM may be the same as or similar to those of the embodiments as shown in FIG. 8G, so they can be referred to the description about FIG. 8G and will not be repeated here.

As shown in FIG. 10A, a second patterned photoresist PR2 is formed on the top metal layer TM. The formation method of the second patterned photoresist PR2 may be the same as or similar to that of the first patterned photoresist PR1, so the formation of the second patterned photoresist PR2 can be referred to the description about FIGS. 1A and 1B and will not be repeated here. The second patterned photoresist PR2 has first hollow portions H1 exposing portions of the top metal layer TM.

Figure 10B:
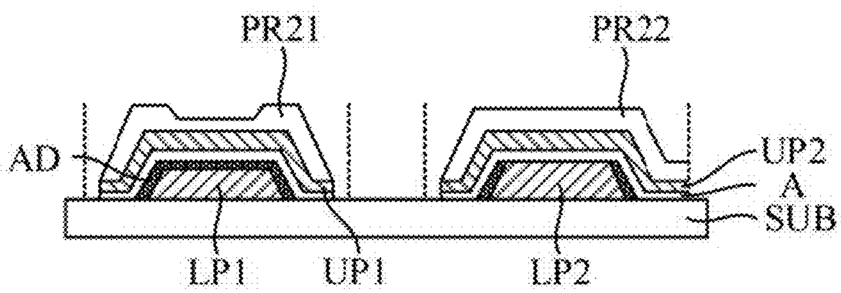

Reference is made to FIG. 10B. FIG. 10B is a schematic cross-sectional view of an intermediate stage of a method of manufacturing an electrode structure according to some embodiments of the present disclosure. The intermediate stage shown in FIG. 10A may be sequentially followed by the intermediate stage shown in FIG. 10B. As shown in FIG. 10B, the top metal layer TM is etched through the second patterned photoresist PR2 to form a first upper metal pattern UP1 and a second upper metal pattern UP2. The first upper metal pattern UP1 is above the anodized first lower metal pattern LP1 and covered by a first mask portion PR21 of the second patterned photoresist PR2. The second upper metal pattern UP2 is above the anodized second lower metal pattern LP2 and covered by a second mask portion PR22 of the second patterned photoresist PR2.

Figure 10C:
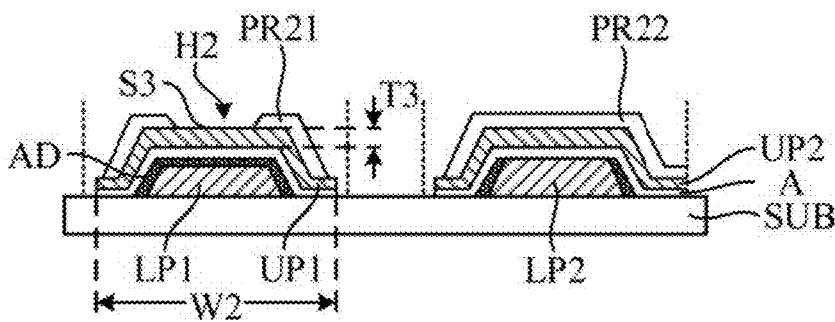

Reference is made to FIG. 10C. FIG. 10C is a schematic cross-sectional view of an intermediate stage of a method of manufacturing an electrode structure according to some embodiments of the present disclosure. The intermediate stage shown in FIG. 10B may be sequentially followed by the intermediate stage shown in FIG. 10C. As shown in FIG. 10C, a part of the first mask portion PR21 of the second patterned photoresist PR2 is removed to form a second hollow portion H2. The second hollow portion H2 exposes a surface portion S3 of the first upper metal pattern UP1. In some embodiments, an ashing process is performed to the second patterned photoresist PR2 until the second hollow portion H2 is formed to expose the surface portion S3 of the first upper metal pattern UP1. In some embodiments, oxygen plasma is used in the ashing process to perform the erosion of the second patterned photoresist PR2.

Figure 10D:
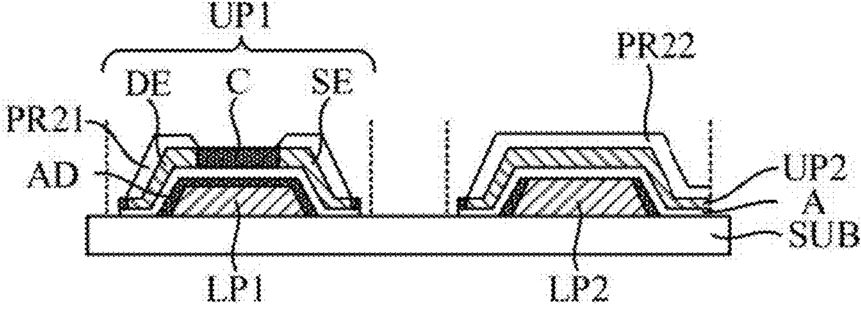

Reference is made to FIG. 10D. FIG. 10D is a schematic cross-sectional view of an intermediate stage of a method of manufacturing an electrode structure according to some embodiments of the present disclosure. The intermediate stage shown in FIG. 10C may be sequentially followed by the intermediate stage shown in FIG. 10D. As shown in FIG. 10D, the surface portion S3 of the first upper metal pattern UP1 is anodized until the first upper metal pattern UP1 has a drain electrode DE, a source electrode SE, and an anodized segment C connected between and electrically isolating the drain electrode DE and the source electrode SE. The anodized segment C serves as a channel protect structure.

In some embodiments, the etched bottom metal layer BM is anodized to reach a termination voltage. The first lower metal pattern LP1 has a thickness (e.g., the vertical thickness T1 of the etched bottom metal layer BM in FIG. 1D) before being anodized, and the termination voltage is less than the thickness in nm divided by 0.9 nm-$V^{-1}$. In this way, the etched bottom metal layer BM will not be fully anodized and leave conductive parts.

In some embodiments, the surface portion S3 of the first upper metal pattern UP1 is anodized to reach a termination voltage. The first upper metal pattern UP1 has a width W2 and a thickness T3 before being anodized, as shown in FIG. 10C. The termination voltage is greater than a smallest one of the width W2 and the thickness T3 in nm divided by 1.0 nm-$V^{-1}$. In this way, it can be ensured that the anodized segment C can reach the side of the first upper metal pattern UP1 facing the semiconductor layer A, as shown in FIG. 10D.

Figure 10E:
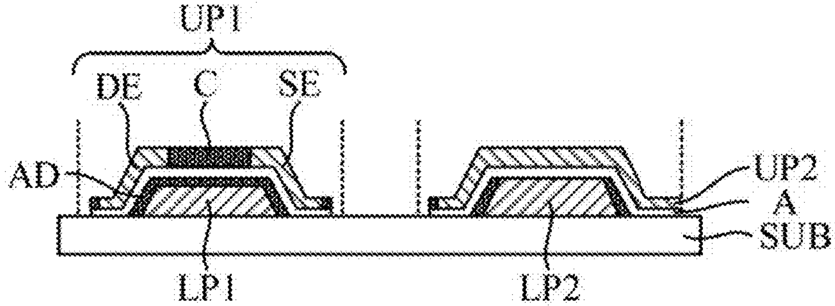

Reference is made to FIG. 10E. FIG. 10E is a schematic cross-sectional view of an intermediate stage of a method of manufacturing an electrode structure according to some embodiments of the present disclosure. The intermediate stage shown in FIG. 10D may be sequentially followed by the intermediate stage shown in FIG. 10E. As shown in FIG. 10E, the second patterned photoresist PR2 is removed to expose the first upper metal pattern UP1 and the second upper metal pattern UP2.

Figure 11A:
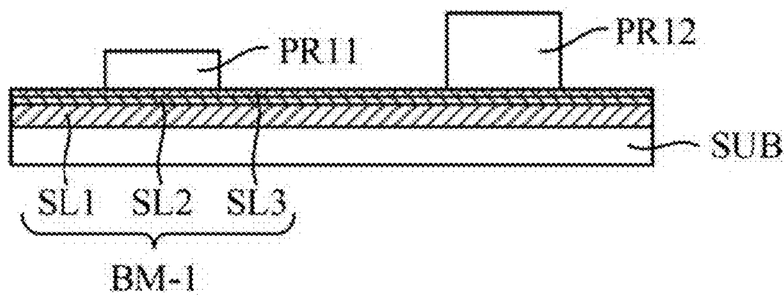
FIGS. 11A to 11F are schematic cross-sectional views of intermediate stages of a method of manufacturing an electrode structure according to some embodiments of the present disclosure.

Reference is made to FIG. 11A. FIG. 11A is a schematic cross-sectional view of an intermediate stage of a method of manufacturing an electrode structure according to some embodiments of the present disclosure. In some embodiments, the intermediate stage shown in FIG. 1A may be directly followed by the intermediate stage shown in FIG. 11A. In other words, the bottom metal layer BM in FIG. 1A is replaced by a bottom metal layer BM-1 in FIG. 11A. As shown in FIG. 11A, the bottom metal layer BM-1 is a multi-layer structure. Specifically, the bottom metal layer BM-1 includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process. The anodization effect of molybdenum is not good, but it can be used as a barrier metal.

In some embodiments, the third sub-layer SL3 contains copper, but the disclosure is not limited in this regard. The third sub-layer SL3 which contains copper can increase the electrical conductivity of an entirety of the bottom metal layer BM-1. In some embodiments, the second sub-layer SL2 which contains molybdenum can serve as a barrier layer to prevent copper diffusion from the third sub-layer SL3 which contains copper.

In some other embodiments, the third sub-layer SL3 may contain a barrier metal such as tantalum, titanium, or tungsten, but the disclosure is not limited in this regard.

In some embodiments, one of the second sub-layer SL2 and the third sub-layer SL3 may be omitted. For example, in some embodiments, the bottom metal layer BM-1 may be a double-layer structure only including the first sub-layer SL1 and the second sub-layer SL2 which contains molybdenum. In some other embodiments, the bottom metal layer BM-1 may be a double-layer structure only including the first sub-layer SL1 and the third sub-layer SL3 which contains copper.

Figure 11B:
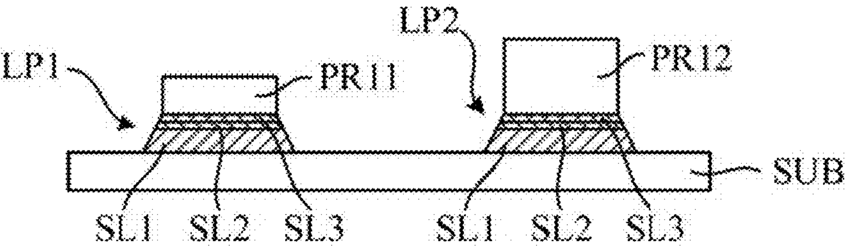

Reference is made to FIG. 11B. FIG. 11B is a schematic cross-sectional view of an intermediate stage of a method of manufacturing an electrode structure according to some embodiments of the present disclosure. The intermediate stage shown in FIG. 11A may be sequentially followed by the intermediate stage shown in FIG. 11B. As shown in FIG. 11B, the bottom metal layer BM-1 is etched through the first patterned photoresist PR1 to form a first lower metal pattern LP1 and a second lower metal pattern LP2. In addition, the first lower metal pattern LP1 and a second lower metal pattern LP2 are respectively covered by the first mask portion PR11 and the second mask portion PR12.

Figure 11C:
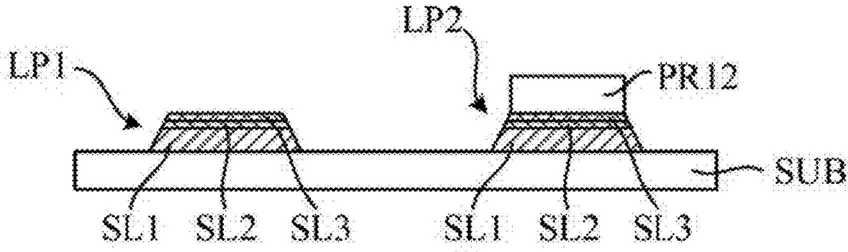

Reference is made to FIG. 11C. FIG. 11C is a schematic cross-sectional view of an intermediate stage of a method of manufacturing an electrode structure according to some embodiments of the present disclosure. The intermediate stage shown in FIG. 11B may be sequentially followed by the intermediate stage shown in FIG. 11C. As shown in FIG. 11C, the first mask portion PR11 is removed to expose a top surface of the third sub-layer SL3 of the first lower metal pattern LP1. The step of removing the first mask portion PR11 as shown in FIG. 11C is the same as or similar to that as shown in FIG. 1D, so it can be referred to the description about FIG. 1D and will not be repeated here.

Figure 11D:
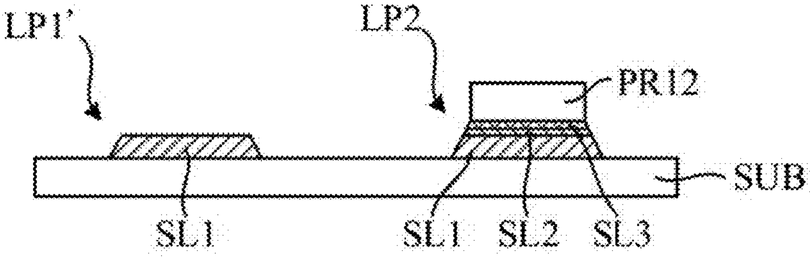

Reference is made to FIG. 11D. FIG. 11D is a schematic cross-sectional view of an intermediate stage of a method of manufacturing an electrode structure according to some embodiments of the present disclosure. The intermediate stage shown in FIG. 11C may be sequentially followed by the intermediate stage shown in FIG. 11D. As shown in FIG. 11D, the third sub-layer SL3 and the second sub-layer SL2 of the first lower metal pattern LP1 are selectively etched (relative to the first sub-layer SL1) to expose a top surface of the first sub-layer SL1. The remaining first sub-layer SL1 of the first lower metal pattern LP1 serves as a first lower metal pattern LP1'.

In some embodiments, the second sub-layer SL2 which contains molybdenum may be etched by using a solution containing hydrogen peroxide and citric acid.

In some embodiments, an etch selectivity of the second sub-layer SL2 and the first sub-layer SL1 in the selectively etching is higher than 2.0.

In some embodiments, the second sub-layer SL2 may be omitted. That is, the bottom metal layer BM-1 may only include the first sub-layer SL1 which contains aluminum and the third sub-layer SL3 which contains copper.

Figure 11E:
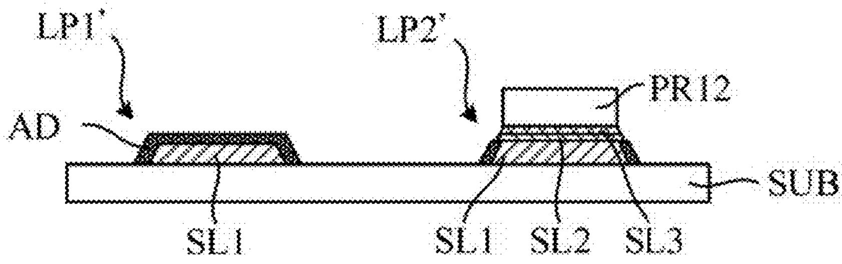

Reference is made to FIG. 11E. FIG. 11E is a schematic cross-sectional view of an intermediate stage of a method of manufacturing an electrode structure according to some embodiments of the present disclosure. The intermediate stage shown in FIG. 11D may be sequentially followed by the intermediate stage shown in FIG. 11E. As shown in FIG. 11E, the first lower metal pattern LP1' is anodized, and the second lower metal pattern LP2 is anodized to form a second lower metal pattern LP2'. The step of anodizing the first lower metal pattern LP1' and the second lower metal pattern LP2 as shown in FIG. 11E is the same as or similar to that as shown in FIG. 1E, so it can be referred to the description about FIG. 1E and will not be repeated here.

Figure 11F:
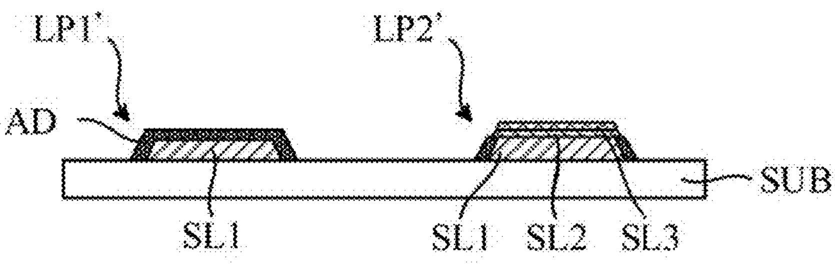

Reference is made to FIG. 11F. FIG. 11F is a schematic cross-sectional view of an intermediate stage of a method of manufacturing an electrode structure according to some embodiments of the present disclosure. The intermediate stage shown in FIG. 11E may be sequentially followed by the intermediate stage shown in FIG. 11F. As shown in FIG. 11F, the second mask portion PR12 is removed to expose a top surface of the third sub-layer SL3 of the second lower metal pattern LP2'. The step of removing the second mask portion PR12 as shown in FIG. 11F is the same as or similar to that as shown in FIG. 1F, so it can be referred to the description about FIG. 1F and will not be repeated here. In some embodiments, the intermediate stage shown in FIG. 11F may be sequentially followed by the intermediate stage shown in FIGS. 8G to 8K.

Figure 12A:
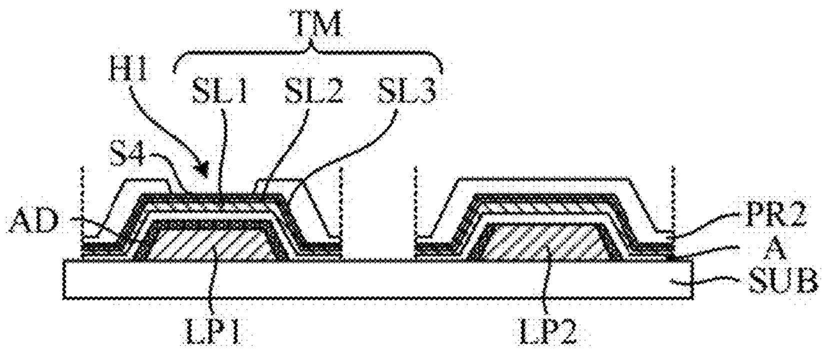
FIGS. 12A to 12C are schematic cross-sectional views of intermediate stages of a method of manufacturing an electrode structure according to some embodiments of the present disclosure.

Reference is made to FIG. 12A. FIG. 12A is a schematic cross-sectional view of an intermediate stage of a method of manufacturing an electrode structure according to some embodiments of the present disclosure. In some embodiments, the intermediate stage shown in FIG. 1F may be directly followed by the intermediate stage shown in FIG. 12A. As shown in FIG. 12A, a semiconductor layer A is deposited on the anodized bottom metal layer BM. A top metal layer TM is deposited on the semiconductor layer A.

A second patterned photoresist PR2 is formed on the top metal layer TM. In other words, the top metal layer TM in FIG. 8G is replaced by the top metal layer TM in FIG. 12A. As shown in FIG. 12A, the top metal layer TM is a multi-layer structure. Specifically, the top metal layer TM includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2. In addition, the second patterned photoresist PR2 has a first hollow portion H1 exposing a surface portion S4 of the top metal layer TM. The surface portion S4 is a portion of the top surface of the third sub-layer SL3 right above the first lower metal pattern LP1.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process.

In some embodiments, the third sub-layer SL3 contains copper, but the disclosure is not limited in this regard.

In some embodiments, one of the second sub-layer SL2 and the third sub-layer SL3 may be omitted.

In some embodiments, the step of depositing the semiconductor layer A as shown in FIG. 12A is the same as or similar to that as shown in FIG. 8G, so it can be referred to the description about FIG. 8G and will not be repeated here. In some embodiments, the step of forming the second patterned photoresist PR2 as shown in FIG. 12A is the same as or similar to that as shown in FIG. 8G, so it can be referred to the description about FIG. 8G and will not be repeated here.

Figure 12B:
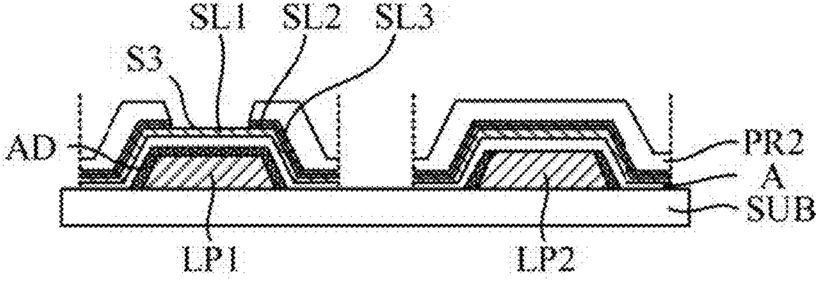

Reference is made to FIG. 12B. FIG. 12B is a schematic cross-sectional view of an intermediate stage of a method of manufacturing an electrode structure according to some embodiments of the present disclosure. The intermediate stage shown in FIG. 12A may be sequentially followed by the intermediate stage shown in FIG. 12B. As shown in FIG. 12B, the third sub-layer SL3 and the second sub-layer SL2 in the first hollow portion H1 are selectively etched relative to the first sub-layer SL1 to expose a surface portion S3 of the first sub-layer SL1 in the first hollow portion H1.

In some embodiments, the second sub-layer SL2 which contains molybdenum may be etched by using hydrogen peroxide and citric acid solution.

In some embodiments, an etch selectivity of the second sub-layer SL2 and the first sub-layer SL1 in the selectively etching is higher than 2.0.

In some embodiments, the second sub-layer SL2 may be omitted. That is, the top metal layer TM may only include the first sub-layer SL1 which contains aluminum and the third sub-layer SL3 which contains copper.

Figure 12C:
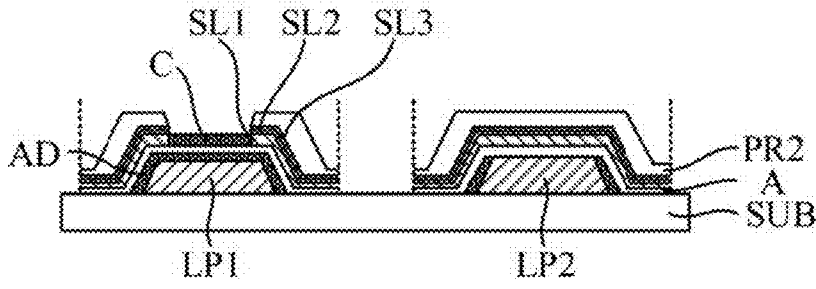

Reference is made to FIG. 12C. FIG. 12C is a schematic cross-sectional view of an intermediate stage of a method of manufacturing an electrode structure according to some embodiments of the present disclosure. The intermediate stage shown in FIG. 12B may be sequentially followed by the intermediate stage shown in FIG. 12C. As shown in FIG. 12C with reference to FIG. 12B, the surface portion S3 of the first sub-layer SL1 exposed by the first hollow portion H1 is anodized through the second patterned photoresist PR2 until the top metal layer TM has an anodized segment C extended from the surface portion of the first sub-layer SL1 exposed by the first hollow portion H1 to a side of the first sub-layer SL1 facing the semiconductor layer A. In some embodiments, the step of anodizing the first sub-layer SL1 of the top metal layer TM as shown in FIG. 12C is the same as or similar to that as shown in FIG. 8H, so it can be referred to the description about FIG. 8H and will not be repeated here.

In some embodiments, the top metal layer TM as shown in FIG. 10A may be replaced by the top metal layer TM as shown in FIG. 12A, and after the top metal layer TM is exposed by the second hollow portion H2 of the second patterned photoresist PR2 as shown in FIG. 10C, the third sub-layer SL3 and the second sub-layer SL2 in the second hollow portion H2 can be selectively etched relative to the first sub-layer SL1 to expose the first sub-layer SL1. Afterwards, the step of anodizing the top metal layer TM (as the intermediate stage shown in FIG. 10D) and the step of removing the second patterned photoresist PR2 can be sequentially performed.

According to the foregoing recitations of the embodiments of the disclosure, it can be seen that the method of manufacturing an electrode structure of the present disclosure can form a floating island structure by only using two sets of PEP. In addition, the method of the present disclosure can also be used to manufacture a thin-film transistor by only using two sets of PEP. Therefore, the manufacturing cost can be significantly reduced and the manufacturing efficiency can be effectively enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing an electrode structure, comprising:
- forming a first patterned photoresist on a bottom metal layer, wherein the first patterned photoresist comprises a first mask portion and a second mask portion thicker than the first mask portion;
- etching the bottom metal layer through the first patterned photoresist to form a first metal pattern, a second metal pattern, and at least one bridge connected between the first and second metal patterns;
- removing the first mask portion while maintaining a remained second mask portion which has a first sub-portion and a second sub-portion, wherein the first sub-portion at least partially covers a top surface of the at least one bridge, and the second sub-portion covers at least one area of a top surface of the second metal pattern;
- anodizing the bottom metal layer with the remained second mask portion covering thereon by flowing an anodizing current from the first metal pattern to the second metal pattern via the at least one bridge;
- removing the remained second mask portion after the anodizing;
- depositing a conductive layer on the bottom metal layer after the remained second mask portion is removed, wherein the conductive layer is in contact with the at least one area of the top surface of the second metal pattern;
- depositing a second patterned photoresist on the conductive layer, wherein a vertical projection of the second patterned photoresist projected on the bottom metal layer at least overlaps the at least one area of the top surface of the second metal pattern;
- etching the conductive layer through the second patterned photoresist until an open segment on the top surface of the at least one bridge that is unanodized is exposed; and
- etching the open segment of the at least one bridge through the second patterned photoresist until the at least one bridge is electrically opened.

2. The method of claim 1, wherein an atomic ratio of aluminum in the bottom metal layer is greater than 80%.

3. The method of claim 2, wherein the anodizing is performed to reach a termination voltage, the etched bottom metal layer has a thickness and a line width, and the termination voltage is less than a smallest one of the thickness and the line width in nm divided by 0.9 nm-V-1.

4. The method of claim 1, wherein a thickness of an unanodized part of the etched bottom metal layer after the anodizing is equal to or greater than 1/10 of a thickness of the etched bottom metal layer before the anodizing.

5. The method of claim 1, wherein a number of the at least one area of the top surface of the second metal pattern is two or more than two.

6. The method of claim 1, wherein the bottom metal layer comprises a first sub-layer containing aluminum and at least one second sub-layer stacked on the first sub-layer, and the method further comprises:
- selectively etching the at least one second sub-layer relative to the first sub-layer to expose the first sub-layer after the removing the first mask portion and before the anodizing.

7. The method of claim 1, wherein the depositing the conductive layer comprises:
- depositing a semiconductor layer to cover the bottom metal layer after the remained second mask portion is removed; and
- depositing a top metal layer on the semiconductor layer,
- wherein the second patterned photoresist has a first mask portion and a second mask portion thicker than the first mask portion, and the method further comprises:
- anodizing the top metal layer with the second patterned photoresist deposited thereon before the etching the conductive layer; and
- removing the first mask portion of the second patterned photoresist after the anodizing the top metal layer and before the etching the conductive layer.

8. The method of claim 7, wherein a surface of the top metal layer in contact with the semiconductor layer contains aluminum.

9. The method of claim 1, wherein the depositing the conductive layer comprises
- depositing a semiconductor layer to cover the bottom metal layer after the remained second mask portion is removed; and
- depositing a top metal layer on the semiconductor layer,
- wherein the second patterned photoresist has a first mask portion and a second mask portion thicker than the first mask portion, and the method further comprises:
- removing the first mask portion of the second patterned photoresist after the etching the conductive layer; and
- anodizing the top metal layer with the second patterned photoresist deposited thereon after the removing the first mask portion.

10. The method of claim 9, wherein a surface of the top metal layer in contact with the semiconductor layer contains aluminum.

11. The method of claim 1, wherein the conductive layer comprises aluminum.

12. The method of claim 1, wherein the conductive layer comprises a first sub-layer containing aluminum and at least one second sub-layer stacked on the first sub-layer, and the etching the conductive layer comprises:

selectively etching the at least one second sub-layer relative to the first sub-layer to expose the first sub-layer; and etching the exposed first sub-layer until the open segment on the at least one bridge is exposed.

13. The method of claim 1, wherein the bottom metal layer comprises at least one element of aluminum, zirconium, hafnium, and tantalum.

14. The method of claim 1, wherein the bottom metal layer comprises at least one rare earth metal element.

15. The method of claim 1, wherein the bottom metal layer comprises aluminum and silicon.

16. The method of claim 1, wherein the at least one area of the top surface of the second metal pattern comprises a first area and a second area, the etching the conductive layer forms a first conductive pattern, a second conductive pattern, and a third conductive pattern spaced apart from each other, the first and second conductive patterns are respectively in contact with the first and second areas, and the third conductive pattern is located between the first and second conductive patterns and extends across the second metal pattern.

17. The method of claim 1, wherein a top surface of the first metal pattern has an anodized zone and at least one unanodized zone after the anodizing.

18. The method of claim 17, wherein an entirety of the at least one unanodized zone of the first metal pattern is covered by the etched conductive layer.

19. The method of claim 1, further comprising reflowing the first sub-portion to partially cover a sidewall of the at least one bridge before the anodizing.

* * * * *